United States Patent
Park et al.

(10) Patent No.: US 7,371,622 B2
(45) Date of Patent: May 13, 2008

(54) ETCHANT FOR SIGNAL WIRE AND METHOD OF MANUFACTURING THIN FILM TRANSISTOR ARRAY PANEL USING ETCHANT

(75) Inventors: Hong-Sick Park, Yongin-si (KR); Hong-Je Cho, Suwon-si (KR); Sung-Chul Kang, Yongin-si (KR); Pong-Ok Park, Seoul (KR); An-Na Park, Busan-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 491 days.

(21) Appl. No.: 10/772,293

(22) Filed: Feb. 6, 2004

(65) Prior Publication Data

US 2004/0242017 A1    Dec. 2, 2004

(30) Foreign Application Priority Data

May 28, 2003 (KR) .................. 10-2003-0034007

(51) Int. Cl.
*H01L 21/00* (2006.01)
(52) U.S. Cl. ................. 438/151; 438/149; 438/584
(58) Field of Classification Search ........... 438/149, 438/15, 584
See application file for complete search history.

(56) References Cited

U.S. PATENT DOCUMENTS 5,994,156 A    11/1999    Voutsas et al.
6,081,308 A    6/2000    Jeong et al.
6,200,694 B1    3/2001    Kohsaka et al.

FOREIGN PATENT DOCUMENTS

| JP | 10-240150 | 9/1998 |
|---|---|---|
| JP | 10-282520 | 10/1998 |
| JP | 2000-275663 | 10/2000 |
| JP | 2001-166336 | 6/2001 |
| KR | 1019990031518 | 5/1999 |

OTHER PUBLICATIONS

English Abstract for Publication No.: 010-240150.
English Abstract for Publication No.: 10-282520.
English Abstract for Publication No.: 1019990031518.
English Abstract for Publication No.: 2000-275663.
English Abstract for Publication No.: 2001-166336.

*Primary Examiner*—Long Pham
(74) *Attorney, Agent, or Firm*—F. Chau & Associates, LLC.

(57) ABSTRACT

Gate lines including a lower Al—Nd layer and an upper MoW layer, data lines including a MoW layer, and pixel electrodes including an IZO layer are patterned using a single etchant. The etchant contains a phosphoric acid of about 50-60%, a nitric acid of about 6-10%, an acetic acid of about 15-25%, a stabilizer of about 2-5% stabilizer, and deionized water. The stabilizer includes oxy-hydride inorganic acid represented by $M(OH)_X L_Y$, where M includes at least one of Zn, Sn, Cr, Al, Ba, Fe, Ti, Si and B, L includes at least one of $H_2O$, $NH_3$, CN and $NH_2R$ (where R is alkyl group), X is 2 or 3, and Y is 0, 1, 2 or 3.

17 Claims, 42 Drawing Sheets

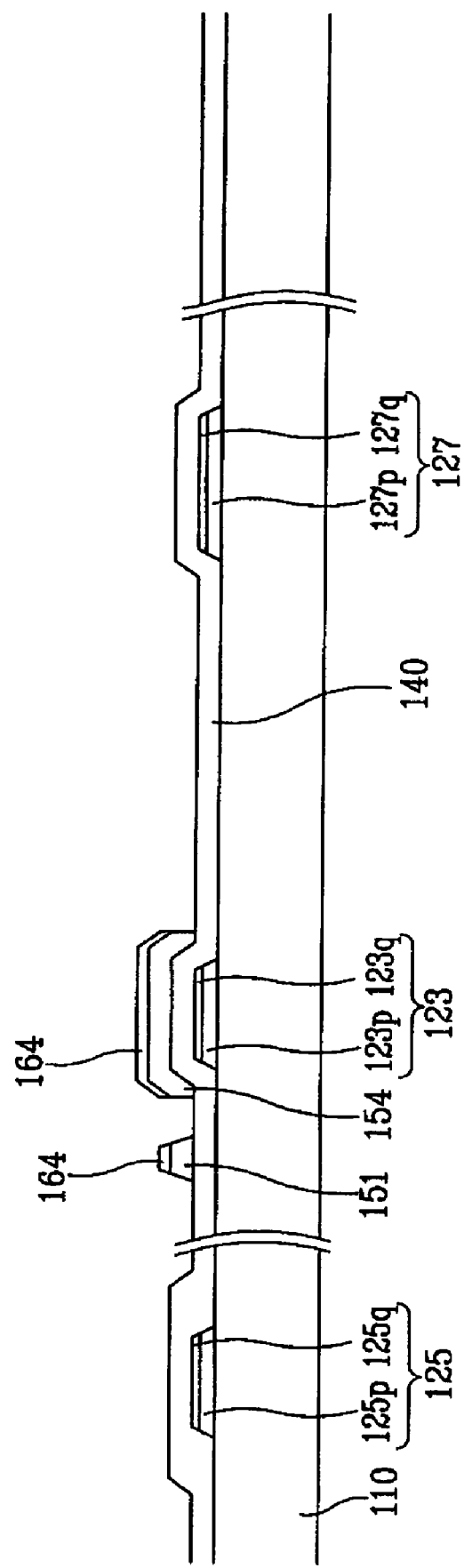

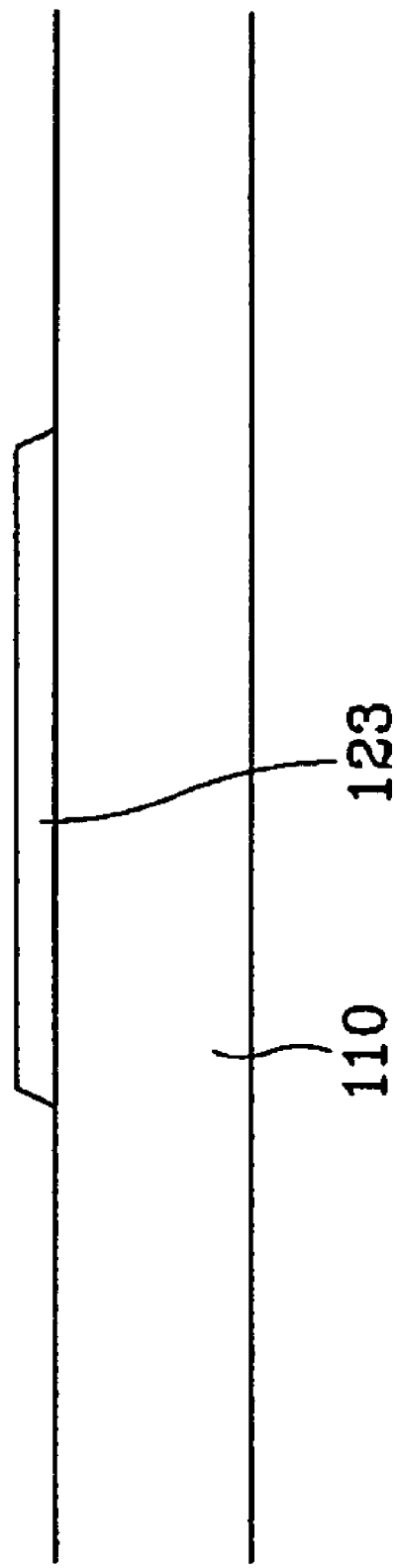

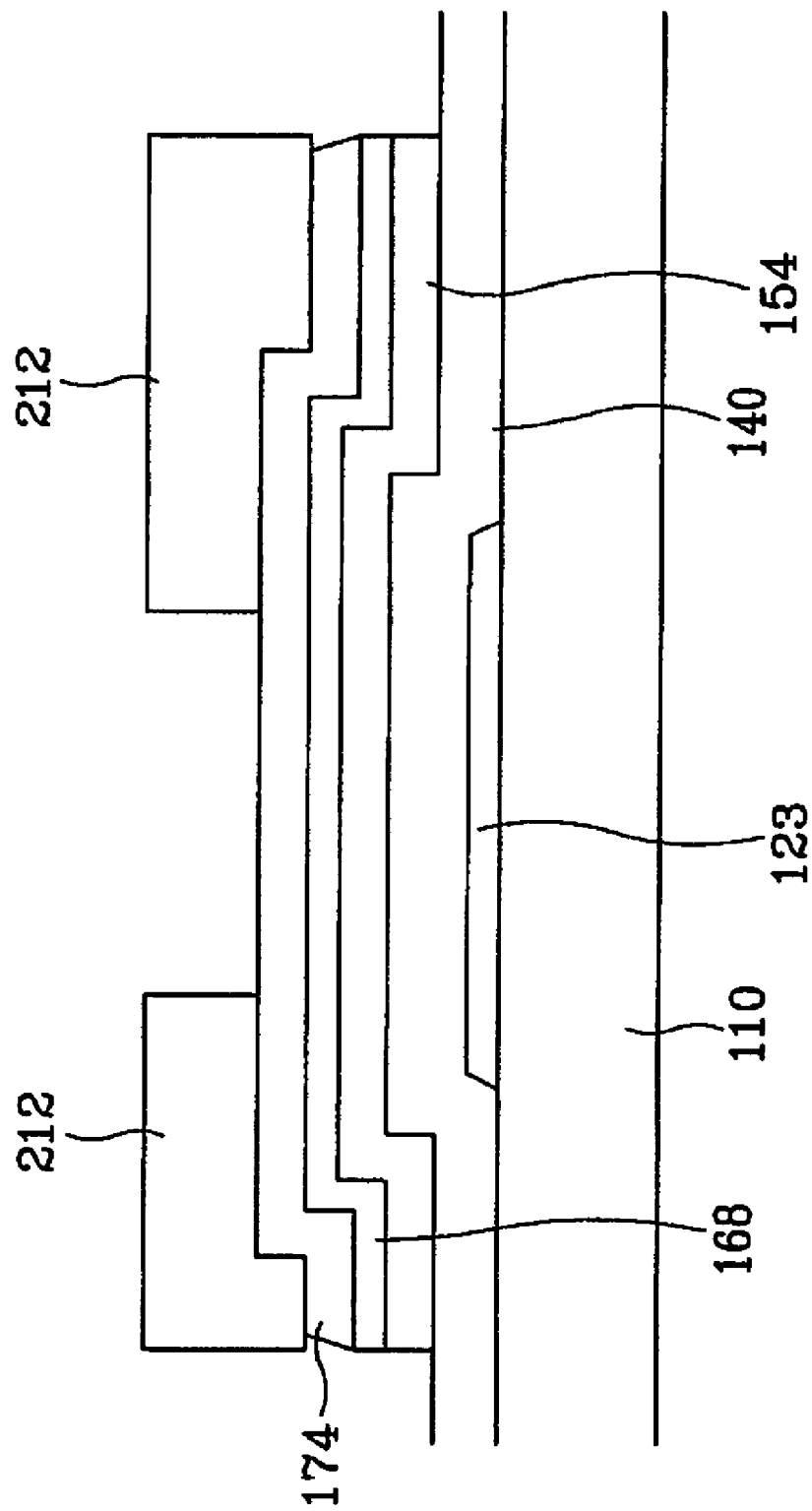

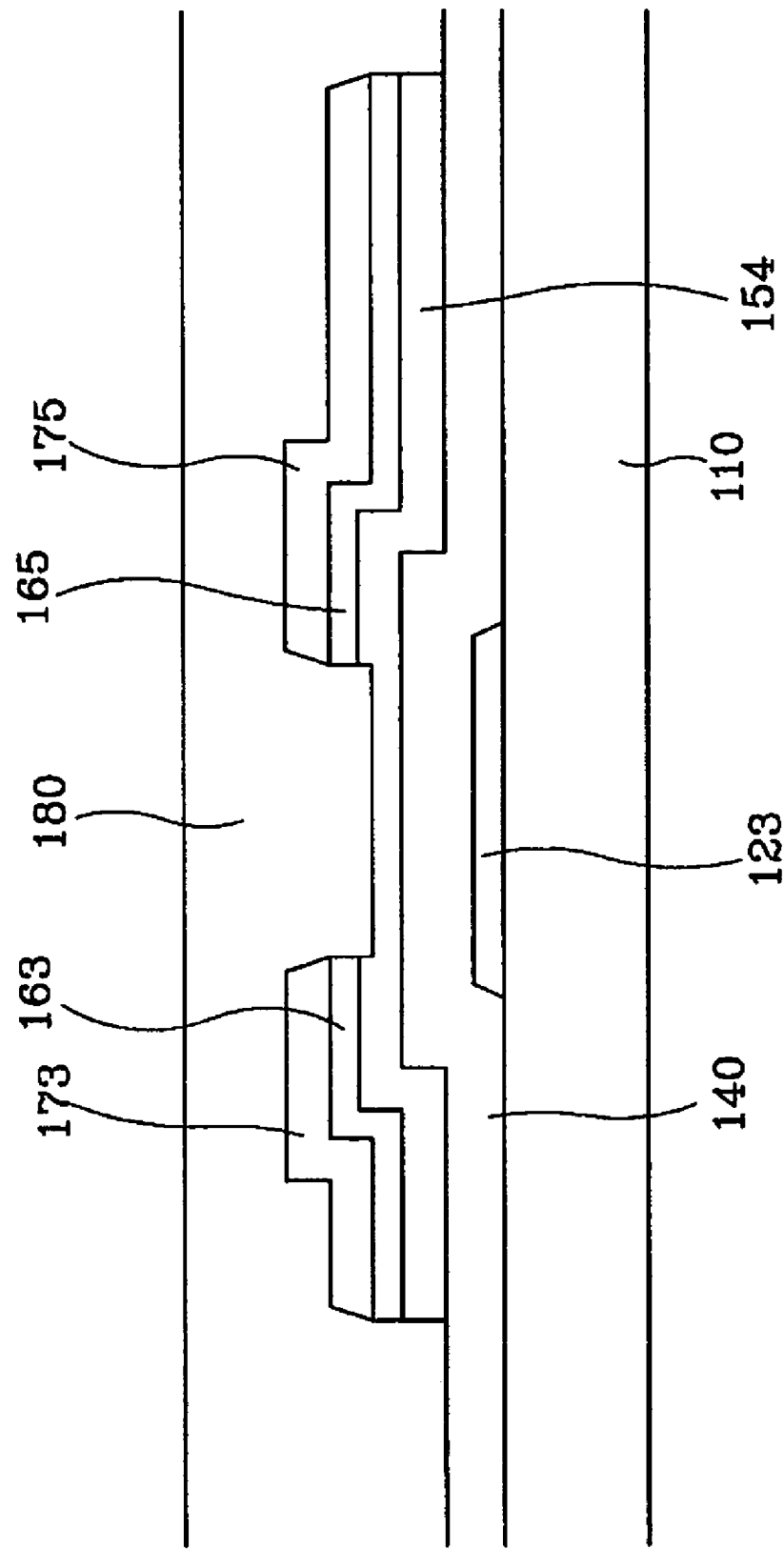

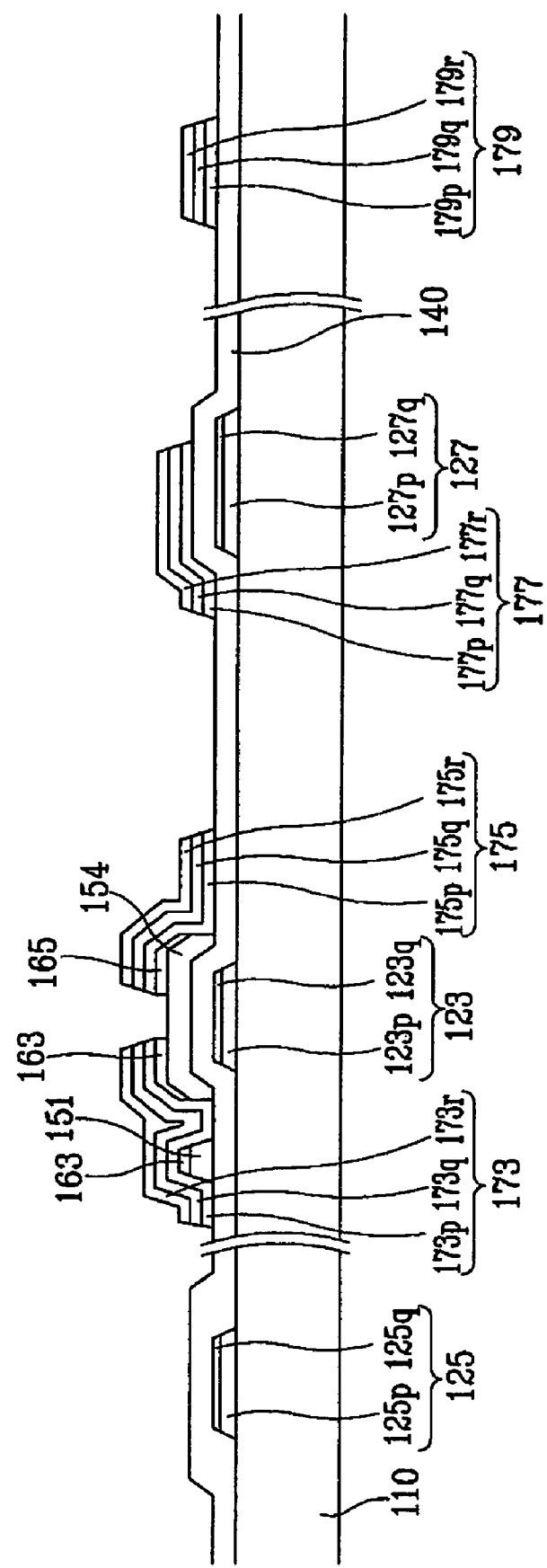

ETCHANT FOR SIGNAL WIRE AND METHOD OF MANUFACTURING THIN FILM TRANSISTOR ARRAY PANEL USING ETCHANT

BACKGROUND OF THE INVENTION (a) Field of the Invention

The present invention relates to an etchant for a signal wire and a manufacturing method of a thin film transistor array panel using an etchant.

(b) Description of the Related Art

Liquid crystal displays (LCDs) are one of the most widely used flat panel displays. An LCD includes two panels provided with field-generating electrodes and a liquid crystal (LC) layer interposed therebetween. The LCD displays images by applying voltages to the field-generating electrodes to generate an electric field in the LC layer, which determines orientations of LC molecules in the LC layer to adjust polarization of incident light.

Among LCDs including field-generating electrodes on respective panels, a kind of LCDs provides a plurality of pixel electrodes arranged in a matrix at one panel and a common electrode covering an entire surface of the other panel. The image display of the LCD is accomplished by applying individual voltages to the respective pixel electrodes. For the application of the individual voltages, a plurality of three-terminal thin film transistors (TFTs) are connected to the respective pixel electrodes, and a plurality of gate lines transmitting signals for controlling the TFTs and a plurality of data lines transmitting voltages to be applied to the pixel electrodes are provided on the panel.

The panel for an LCD has a layered structure including several conductive layers and several insulating layers. The gate lines, the data lines, and the pixel electrodes are made from different conductive layers (referred to as "gate conductor," "data conductor," and "pixel conductor" hereinafter) preferably deposited in sequence and separated by insulating layers. A TFT includes three electrodes: a gate electrode made from the gate conductor and source and drain electrodes made from the data conductor. The source electrode and the drain electrode are connected by a semiconductor usually located thereunder, and the drain electrode is connected to the pixel electrode through a hole in an insulating layer.

The gate conductor and the data conductor are preferably made of Al containing metal such as Al and Al alloy having low resistivity for reducing the signal delay in the gate lines and the data lines. The data conductor also includes a refractory metal for good contact with the semiconductor. The pixel electrodes are usually made of transparent conductive material such as indium tin oxide (ITO) for both the field generation upon voltage application and the light transmission.

In the meantime, the conductors are patterned by dry etching or wet etching with an etchant. An etchant for patterning dual layers of Al (or Al—Nd alloy) and Mo is disclosed in Korean Patent Application Publication No. 2001-75932, an etchant for patterning triple layers of Mo, Al (or Al—Nd alloy), and Mo is disclosed in Korean Patent Application Publication Ser. No. 2001-91799, and an etchant for patterning a layer of ITO is disclosed in Korean Patent Application Publication Ser. No. 2002-33025.

Since different layers are etched using different etching conditions, the manufacturing process is complicated and the manufacturing cost is expensive.

SUMMARY OF THE INVENTION

A method of manufacturing a thin film transistor array panel is provided, the method includes: forming a gate conductor on an insulating substrate; forming a gate insulating layer; forming a semiconductor member; forming a data conductor; and forming a pixel electrode connected to the drain electrode, wherein the gate conductor, the data conductor, and the pixel electrode are formed using a single etchant.

The etchant preferably contains about 50-60% $H_3PO_4$, about 6-10% $HNO_3$, about 15-25% $CH_3COOH$, about 2-5% stabilizer, and deionized water. The stabilizer may contain oxy-hydride inorganic acid represented by $M(OH)_xL_y$, where M includes at least one of Zn, Sn, Cr, Al, Ba, Fe, Ti, Si and B, L includes at least one of $H_2O$, $NH_3$, CN and $NH_2R$ (where R is alkyl group), X is 2 or 3, and Y is 0, 1, 2 or 3.

The gate conductor preferably includes a lower film of Al or Al alloy, more preferably Al—Nd, and an upper film of Mo or Mo alloy, more preferably MoW.

The data conductor preferably includes Mo or Mo alloy, and the pixel electrode preferably includes IZO.

The lower layer of the gate conductor, the upper layer of the gate conductor, the data conductor, and the pixel electrode may have thickness of about 1,500-3,000 Å, about 300-600 Å, about 1,500-3,000 Å, and about 800-1,000 Å, respectively.

The etchant preferably contains about 65-75% $H_3PO_4$, about 0.5-4% $HNO_3$, about 9-13% $CH_3COOH$, about 2-5% stabilizer, and deionized water. The stabilizer may contain oxy-hydride inorganic acid represented by $M(OH)_xL_y$, where M includes at least one of Zn, Sn, Cr, Al, Ba, Fe, Ti, Si and B, L includes at least one of $H_2O$, $NH_3$, CN and $NH_2R$ (where R is alkyl group), X is 2 or 3, and Y is 0, 1, 2 or 3.

The gate conductor preferably includes a lower film of Al or Al alloy, more preferably Al—Nd, and an upper film of Mo.

The data conductor preferably includes a bottom layer of Mo, an intermediate layer of Al or Al alloy, and a top layer of Mo, and the pixel electrode preferably includes IZO.

A method of manufacturing a thin film transistor array panel is provided, which includes: forming a gate conductor on an insulating substrate; forming a gate insulating layer; forming a semiconductor member; forming a data conductor; and forming a pixel electrode connected to the drain electrode, wherein at least one of the gate conductor, the data conductor, and the pixel electrode are formed by using an etchant including a phosphoric acid of about 50-60%, a nitric acid of about 6-10%, an acetic acid of about 15-25%, a stabilizer of about 2-5% stabilizer, and deionized water, or an etchant including a phosphoric acid of about 65-75%, a nitric acid of about 0.5-4%, an acetic acid of about 9-13%, a stabilizer of about 2-5% stabilizer, and deionized water, where the stabilizer includes oxy-hydride inorganic acid represented by $M(OH)_xL_y$, where M includes at least one of Zn, Sn, Cr, Al, Ba, Fe, Ti, Si and B, L includes at least one of $H_2O$, $NH_3$, CN and $NH_2R$ (where R is alkyl group), X is 2 or 3, and Y is 0, 1, 2 or 3.

At least two of the gate conductor, the data conductor, and the pixel electrode preferably include at least one of Mo, Mo alloy, Al, Al alloy, and IZO, and furthermore, each of the gate conductor, the data conductor, and the pixel electrode may include at least one of Mo, Mo alloy, Al, Al alloy, and IZO.

An etchant for a signal wire according to an embodiment of the present invention includes: a phosphoric acid of about 50-60%; a nitric acid of about 6-10%; an acetic acid of about 15-25%; a stabilizer of about 2-5% stabilizer; and deionized water, wherein the stabilizer. includes oxy-hydride inorganic acid represented by $M(OH)_XL_Y$, where M includes at least one of Zn, Sn, Cr, Al, Ba, Fe, Ti, Si and B, L includes at least one of $H_2O$, $NH_3$, CN and $NH_2R$ (where R is alkyl group), X is 2 or 3, and Y is 0, 1, 2 or 3.

An etchant for a signal wire according to another embodiment of the present invention includes: a phosphoric acid of about 65-75%; a nitric acid of about 0.5-4%; an acetic acid of about 9-13%; a stabilizer of about 2-5% stabilizer; and deionized water, wherein the stabilizer includes oxy-hydride inorganic acid represented by $M(OH)_XL_Y$, where M includes at least one of Zn, Sn, Cr, Al, Ba, Fe, Ti, Si and B, L includes at least one of $H_2O$, $NH_3$, CN and $NH_2R$ (where R is alkyl group), X is 2 or 3, and Y is 0, 1, 2 or 3.

The etchant may be used for patterning an Al or Al alloy layer, a Mo or Mo alloy layer, and multiple layers including an Al or Al alloy layer and a Mo or Mo alloy layer, and it may also be used for patterning an IZO layer.

The etchant may be used for patterning multiple layers including a Mo layer, an Al or Al alloy layer, and a Mo layer deposited in sequence.

BRIEF DESCRIPTION OF THE DRAWINGS

The present invention will become more apparent by describing embodiments thereof in detail with reference to the accompanying drawings in which:

FIGS. 6B, 7B, 8B and 9B are sectional views of the TFT array panel shown in FIGS. 6A, 7A, 8A and 9A taken along the lines VIB-VIB', VIIB-VIIB', VIIIB-VIIIB', and IXB-IXB', respectively;

FIGS. 13B and 13C are sectional views of the TFT array panel shown in FIG. 13A taken along the lines XIIIB-XIIIB' and XIIIC-XIIIC', respectively;

FIGS. 16A, 17A and 18A and FIGS. 16B, 17B and 18B are respective sectional views of the TFT array panel shown in FIG. 15A taken along the lines XVB-XVB' and XVC-XVC', respectively, and illustrate the steps following the step shown in FIGS. 15B and 15C;

FIGS. 19B and 19C are sectional views of the TFT array panel shown in FIG. 19A taken along the lines XIXB-XIXB' and XIXC-XIXC', respectively;

FIGS. 22B, 23B, 24B and 25B are sectional views of the TFT array panel shown in FIGS. 22A, 23A, 24A and 25A taken along the lines XXIIB-XXIIB', XXIIIB-XXIIIB', XXIVB-XXIVB', and XXV-XXV', respectively.

DETAILED DESCRIPTION OF EMBODIMENTS

Figure 1:
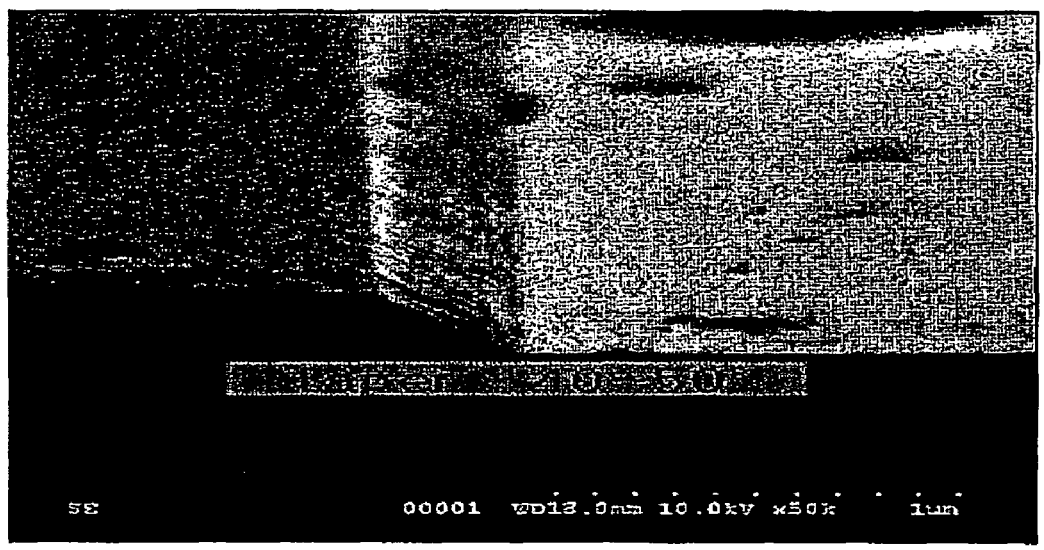
FIGS. 1-3 are photographs of sections of signal wires etched by a single etchant according to an embodiment of the present invention.

The present invention now will be described more fully hereinafter with reference to the accompanying drawings, in which preferred embodiments of the invention are shown. The present invention may, however, be embodied in many different forms and should not be construed as limited to the embodiments set forth herein.

In the drawings, the thickness of layers, films and regions are exaggerated for clarity. Like numerals refer to like elements throughout. It will be understood that when an element such as a layer, film, region or substrate is referred to as being "on" another element, it can be directly on the other element or intervening elements may also be present. In contrast, when an element is referred to as being "directly on" another element, there are no intervening elements present.

Now, etchants for a wire, TFT array panels and manufacturing methods thereof according to embodiments of the present invention will be described with reference to the accompanying drawings.

Figure 2:
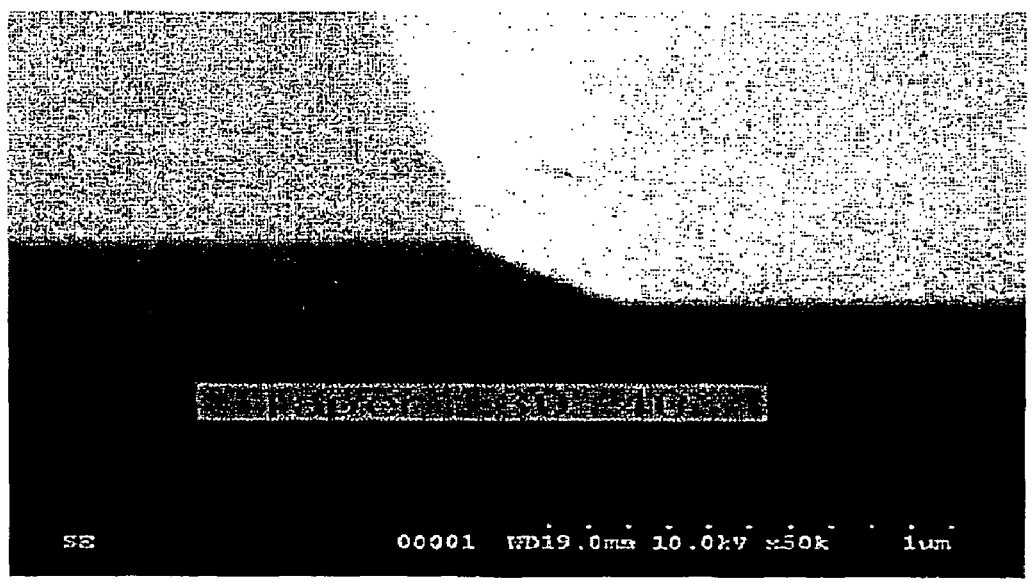
Figure 3:

FIGS. 1-3 are photographs of sections of signal wires etched by a single etchant according to an embodiment of the present invention.

A conductive layer was deposited on a substrate and etched using an etchant contains about 55% phosphoric acid ($H_3PO_4$), about 8% nitric acid ($HNO_3$), about 19% acetic acid ($CH_3COOH$), about 3% stabilizer, and deionized water. The stabilizer includes oxy-hydride inorganic acid represented by $M(OH)_XL_Y$, where M is Zn, Sn, Cr, Al, Ba, Fe, Ti, Si or B, L is $H_2O$, $NH_3$, CN or $NH_2R$ (where R is alkyl group), X is 2 or 3, and Y is 0, 1, 2 or 3.

Referring to FIG. 1, the conductive layer includes a lower Al—Nd alloy layer having a thickness of about 2,500 Å and an upper MoW alloy layer of about 500 Å and the substrate was dipped into the etchant for etching the conductive layer. The photograph shows that the etched lateral side of the conductive layer has an inclination angle (or taper angle) of 40-50 degrees with respect to the substrate.

Referring to FIG. 2, the conductive layer is made of MoW alloy and has a thickness of about 2,000 Å and the etchant was sprayed over the substrate for etching the conductive layer. The photograph shows that the etched lateral side of the conductive layer has an inclination angle of 30-40 degrees with respect to the surface of the substrate.

Referring to FIG. 3, the conductive layer is made of IZO and has a thickness of about 900 Å and the etchant was sprayed over the substrate for etching the conductive layer. The photograph shows that the etched lateral side of the conductive layer has an inclination angle of 25-30 degrees with respect to the surface of the substrate.

Consequently, the conductive layers made of Al—Nd alloy, MoW alloy, and IZO are etched by a single etchant such that the inclination angles of the later sides of the conductive layers ranges from about 25 degrees to about 50 degrees.

A TFT array panel for an LCD will be described in detail with reference to FIGS. 4 and 5.

Figure 4:
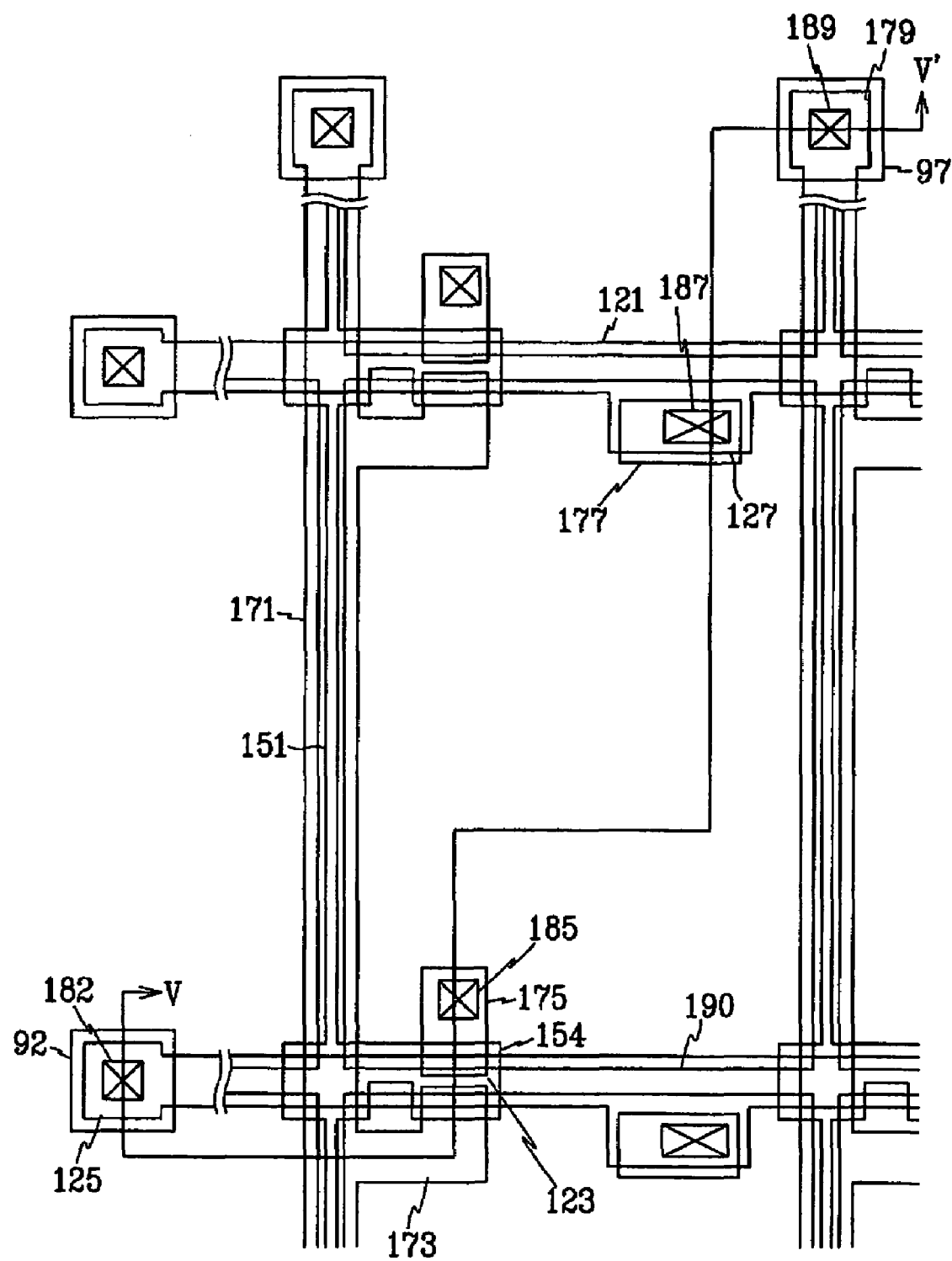
FIG. 4 is a layout view of an exemplary TFT array panel for an LCD according to an embodiment of the present invention.
Figure 5:
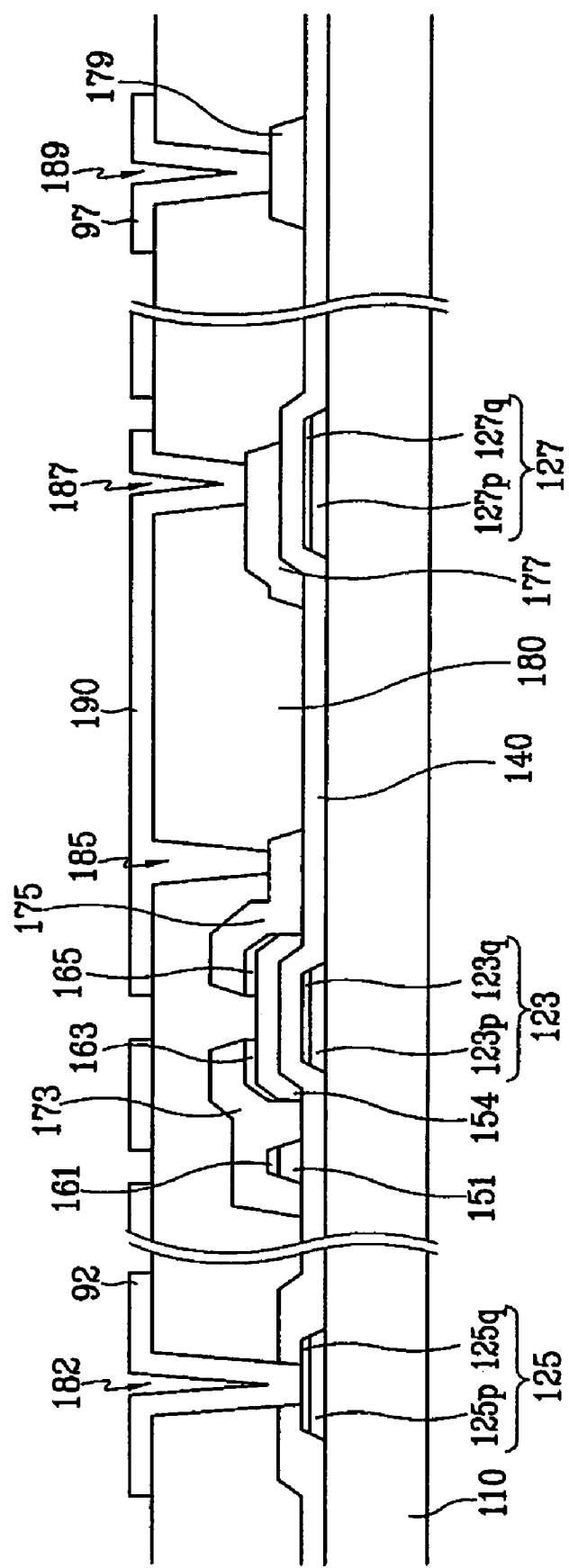
FIG. 5 is a sectional view of the TFT array panel shown in FIG. 4 taken along the line V-V'.

FIG. 4 is an exemplary layout view of TFTs, pixel electrodes, portions of signal lines located on the display area and expansions of the signal lines located on the peripheral area of the exemplary TFT array panel shown in FIG. 2 according to an embodiment of the present invention, and FIG. 5 is a sectional view of the TFT array panel shown in FIG. 4 taken along the line V-V'.

A plurality of gate lines 121 for transmitting gate signals are formed on an insulating substrate 110. Each gate line 121 extends substantially in a transverse direction and a plurality of portions of each gate line 121 form a plurality of gate electrodes 123. Each gate line 121 includes a plurality of projections 127 protruding downward and an expansion 125 having wider width for contact with another layer or an external device.

The gate lines 121 include two films having different physical characteristics, a lower film 121p and an upper film 121q. The lower film 121p is preferably made of low resistivity metal including Al containing metal such as Al and Al alloy for reducing signal delay or voltage drop in the gate lines 121. On the other hand, the upper film 121q is preferably made of material such as Mo and Mo alloy, which has good physical, chemical, and electrical contact characteristics with other materials such as indium tin oxide (ITO) and indium zinc oxide (IZO). A good exemplary combination of the lower film material and the upper film material is Al—Nd alloy and Mo—W alloy. In FIG. 5, the lower and the upper films of the gate electrodes 123 are indicated by reference numerals 123p and 123q, respectively, the lower and the upper films of the projections 127 are indicated by reference numerals 127p and 127q, and the lower and the upper films of the expansions 125 are indicated by reference numerals 125p and 125q, respectively. However, the expansions 125 of the gate lines 121 include only a lower film.

In addition, the lateral sides of the upper film 121q and the lower film 121p are tapered, and the inclination angle of the lateral sides with respect to a surface of the substrate 110 ranges about 20-80 degrees.

A gate insulating layer 140 preferably made of silicon nitride (SiNx) is formed on the gate lines 121.

A plurality of semiconductor stripes 151 preferably made of hydrogenated amorphous silicon (abbreviated to "a-Si") are formed on the gate insulating layer 140. Each semiconductor stripe 151 extends substantially in the longitudinal direction and has a plurality of projections 154 branched out toward the gate electrodes 123. The width of each semiconductor stripe 151 becomes large near the gate lines 121 such that the semiconductor stripe 151 covers large areas of the gate lines 121.

A plurality of ohmic contact stripes and islands 161 and 165 preferably made of silicide or n+ hydrogenated a-Si heavily doped with n type impurity are formed on the semiconductor stripes 151. Each ohmic contact stripe 161 has a plurality of projections 163, and the projections 163 and the ohmic contact islands 165 are located in pairs on the projections 154 of the semiconductor stripes 151.

The lateral sides of the semiconductor stripes 151 and the ohmic contacts 161 and 165 are tapered, and the inclination angles thereof are preferably in a range between about 30-80 degrees.

A plurality of data lines 171, a plurality of drain electrodes 175, and a plurality of storage capacitor conductors 177 are formed on the ohmic contacts 161 and 165 and the gate insulating layer 140.

The data lines 171 for transmitting data voltages extend substantially in the longitudinal direction and intersect the gate lines 121. Each data line 171 includes an expansion 179 having wider width for contact with another layer or an external device.

A plurality of branches of each data line 171, which project toward the drain electrodes 175, form a plurality of source electrodes 173. Each pair of the source electrodes 173 and the drain electrodes 175 are separated from each other and opposite each other with respect to a gate electrode 123. A gate electrode 123, a source electrode 173, and a drain electrode 175 along with a projection 154 of a semiconductor stripe 151 form a TFT having a channel formed in the projection 154 disposed between the source electrode 173 and the drain electrode 175.

The storage capacitor conductors 177 overlap the projections 127 of the gate lines 121.

The data lines 171, the drain electrodes 175, and the storage capacitor conductors 177 is preferably made of Mo or Mo alloy, and more preferably, it is made of Mo—W alloy. They may include an upper film (not shown) preferably made of Mo, Mo alloy and an underlying lower film (not shown) preferably made of Al containing metal. In addition, they may further include a Mo or Mo alloy film disposed under the Al containing metal film.

Like the gate lines 121, the data lines 171, the drain electrodes 175, and the storage capacitor conductors 177 have tapered lateral sides, and the inclination angles thereof range about 30-80 degrees.

The ohmic contacts 161 and 165 are interposed only between the underlying semiconductor stripes 151 and the overlying data lines 171 and the overlying drain electrodes 175 thereon and reduce the contact resistance therebetween. The semiconductor stripes 151 include a plurality of exposed portions, which are not covered with the data lines 171 and the drain electrodes 175, such as portions located between the source electrodes 173 and the drain electrodes 175. Although the semiconductor stripes 151 are narrower than the data lines 171 at most places, the width of the semiconductor stripes 151 becomes large near the gate lines 121 as described above, to smooth the profile of the surface, thereby preventing the disconnection of the data lines 171.

A passivation layer 180 is formed on the data lines 171, the drain electrodes 175, the storage conductors 177, and the exposed portions of the semiconductor stripes 151. The passivation layer 180 is preferably made of photosensitive organic material having a good flatness characteristic, low dielectric insulating material having dielectric constant lower than 4.0 such as a-Si:C:O and a-Si:O:F formed by plasma enhanced chemical vapor deposition (PECVD), or inorganic material such as silicon nitride. The passivation layer 180 may have a dual layered structure including an inorganic lower layer preferably made of silicon nitride and an organic upper layer such that the exposed portions of the semiconductor stripes 151 is in contact with the inorganic layer. Furthermore, the thick organic insulating layer is removed in a peripheral area provided with the expansions 125 and 179 of the gate lines 121 and the data lines 179 for smooth contact between the expansions 125 and 179 and external driving circuits and this configuration is particularly advantageous for a COG (chip on glass) type mounting.

The passivation layer 180 has a plurality of contact holes 185, 187 and 189 exposing the lower films 175p of the drain electrodes 175, the lower films 177p of the storage conductors 177, and the expansions 179 of the data lines 171, respectively. The passivation layer 180 and the gate insulating layer 140 have a plurality of contact holes 182 exposing the expansions 125 of the gate lines 121. FIGS. 4 and 5 shows that the contact holes 182, 185, 187 and 189 have inclined sidewalls.

A plurality of pixel electrodes 190 and a plurality of contact assistants 92 and 97, which are preferably made of IZO, are formed on the passivation layer 180.

The pixel electrodes 190 are physically and electrically connected to the drain electrodes 175 through the contact holes 185 and to the storage capacitor conductors 177 through the contact holes 187 such that the pixel electrodes 190 receive the data voltages from the drain electrodes 175 and transmit the received data voltages to the storage capacitor conductors 177.

The pixel electrodes 190 supplied with the data voltages generate electric fields in cooperation with a common electrode (not shown) on another panel (not shown), which reorient liquid crystal molecules in a liquid crystal layer (not shown) disposed therebetween.

A pixel electrode 190 and a common electrode form a liquid crystal capacitor, which stores applied voltages after turn-off of the TFT. An additional capacitor called a "storage capacitor," which is connected in parallel to the liquid crystal capacitor, is provided for enhancing the voltage storing capacity. The storage capacitors are implemented by overlapping the pixel electrodes 190 with the gate lines 121 adjacent thereto (called "previous gate lines"). The capacitances of the storage capacitors, i.e., the storage capacitances are increased by providing the projections 127 at the gate lines 121 for increasing overlapping areas and by providing the storage capacitor conductors 177, which are connected to the pixel electrodes 190 and overlap the projections 127, under the pixel electrodes 190 for decreasing the distance between the terminals.

The pixel electrodes 190 overlap the gate lines 121 and the data lines 171 to increase aperture ratio but it is optional.

The contact assistants 92 and 97 are connected to the exposed expansions 125 of the gate lines 121 and the exposed expansions 179 of the data lines 171 through the contact holes 182 and 189, respectively. The contact assistants 92 and 97 are not requisites but preferred to protect the exposed portions 125 and 179 and to complement the adhesiveness of the exposed portions 125 and 179 and external devices.

According to another embodiment of the present invention, a plurality of metal islands (not shown) are formed near the expansions 125 and 129 of the gate lines 121 and the data lines 179 and they are connected to the contact assistants 92 and 97 through a plurality of contact holes (not shown) are formed in the passivation layer 180 and/or the gate insulating layer 140.

A method of manufacturing the TFT array panel shown in FIGS. 4 and 5 according to an embodiment of the present invention will be now described in detail with reference to FIGS. 6A to 9B as well as FIGS. 4 and 5.

FIGS. 6A, 7A, 8A and 9A are layout views of the TFT array panel shown in FIGS. 4 and 5 in intermediate steps of a manufacturing method thereof according to an embodiment of the present invention, and FIGS. 6B, 7B, 8B and 9B are sectional views of the TFT array panel shown in FIGS. 6A, 7A, 8A and 9A taken along the lines VIB-VIB', VIIB-VIIB', VIIIB-VIIIB', and IXB-IXB', respectively.

Two conductive films, a lower conductive film and an upper conductive film are sputtered in sequence on an insulating substrate 110 such as transparent glass. The lower conductive film has a thickness of about 1,500-3,000 Å, preferably 2,500 Å, and is made of Al—Nd alloy, while the upper conductive film has a thickness of about 300-600 Å, preferably 500 Å, and is made of Mo—W alloy.

Figure 6A:
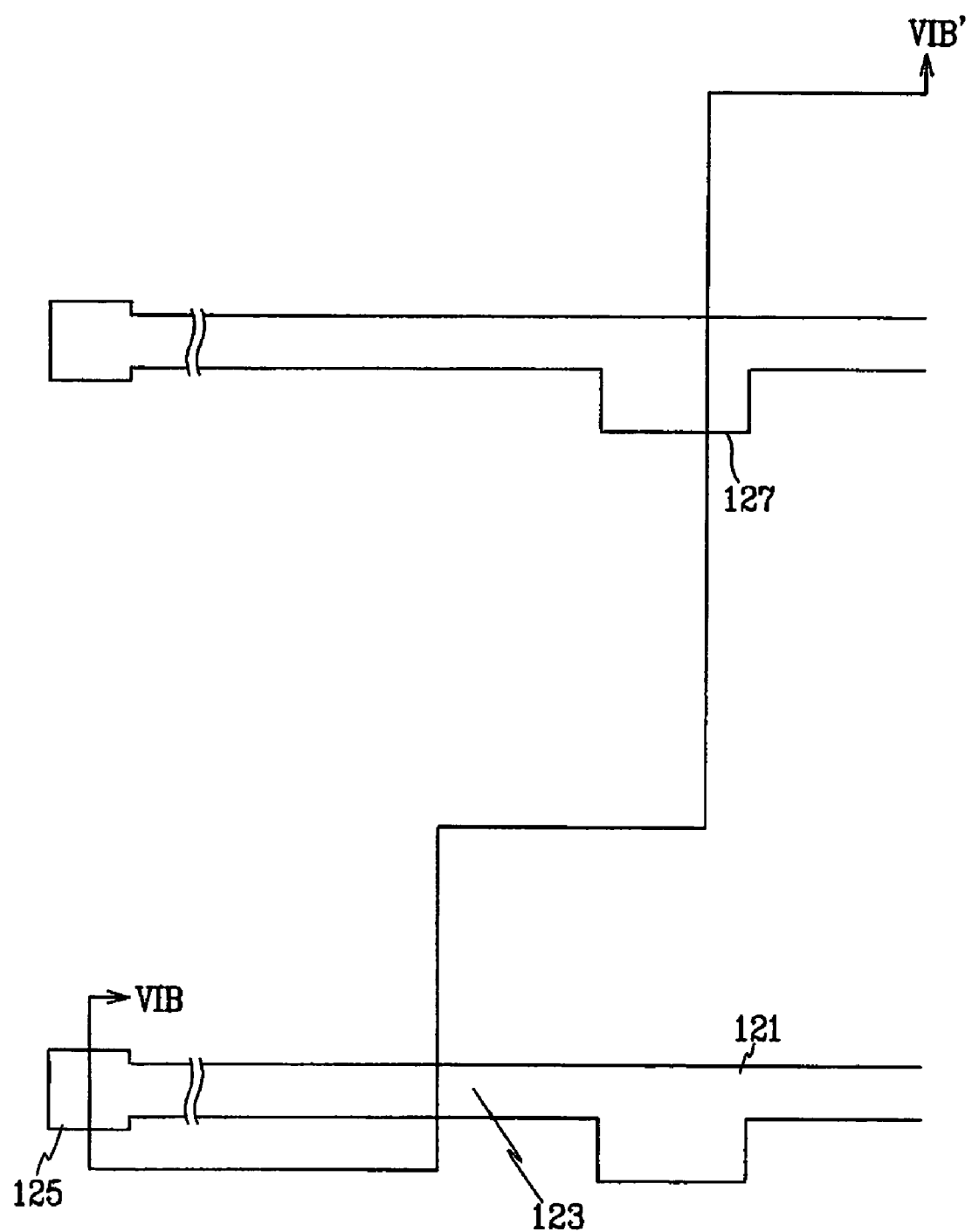
FIGS. 6A, 7A, 8A and 9A are layout views of the TFT array panel shown in FIGS. 4 and 5 in intermediate steps of a manufacturing method thereof according to an embodiment of the present invention.
Figure 6B:
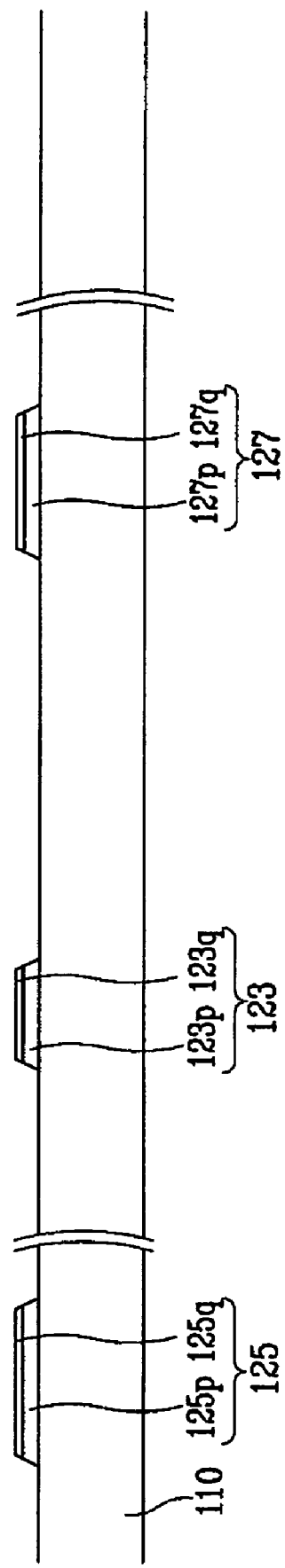

Referring to FIGS. 6A and 6B, the upper conductive film and the lower conductive film are simultaneously patterned by photolithography and wet etch with an etchant to form a plurality of gate lines 121 including a plurality of gate electrodes 123, a plurality of projections 127, and a plurality of expansions 125. The etchant contains about 50-60% phosphoric acid ($H_3PO_4$), about 6-10% nitric acid ($HNO_3$), about 15-25% acetic acid ($CH_3COOH$), about 2-5% stabilizer, and deionized water. The stabilizer includes oxyhydride inorganic acid represented by $M(OH)_XL_Y$, where M is Zn, Sn, Cr, Al, Ba, Fe, Ti, Si or B, L is $H_2O$, $NH_3$, CN or $NH_2R$ (where R is alkyl group), X is 2 or 3, and Y is 0, 1, 2 or 3.

Figure 7A:
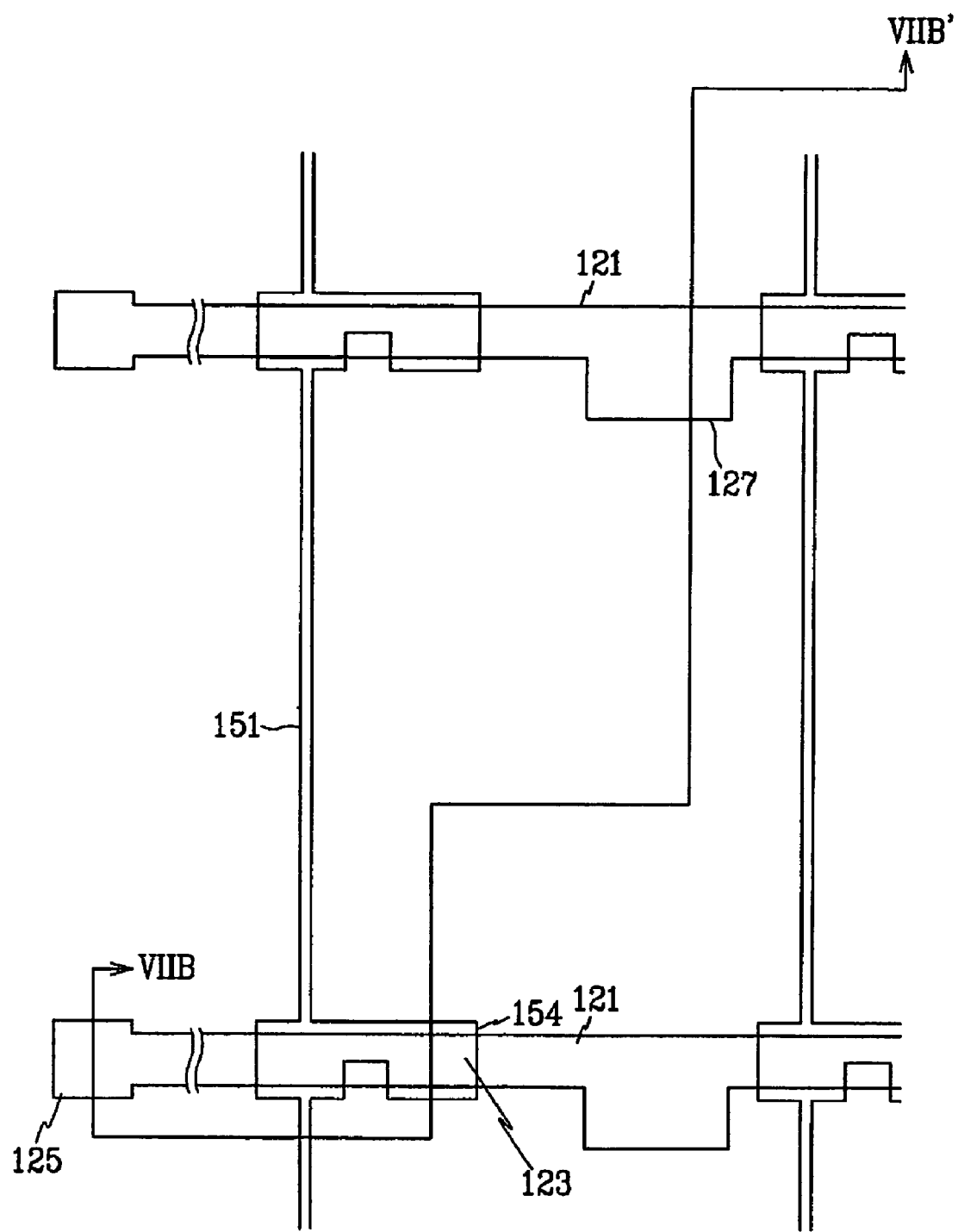

Referring to FIGS. 7A and 7B, after sequential deposition of a gate insulating layer 140, an intrinsic a-Si layer, and an extrinsic a-Si layer, the extrinsic a-Si layer and the intrinsic a-Si layer are photo-etched to form a plurality of extrinsic semiconductor stripes 164 and a plurality of intrinsic semiconductor stripes 151 including a plurality of projections 154 on the gate insulating layer 140.

Figure 8A:
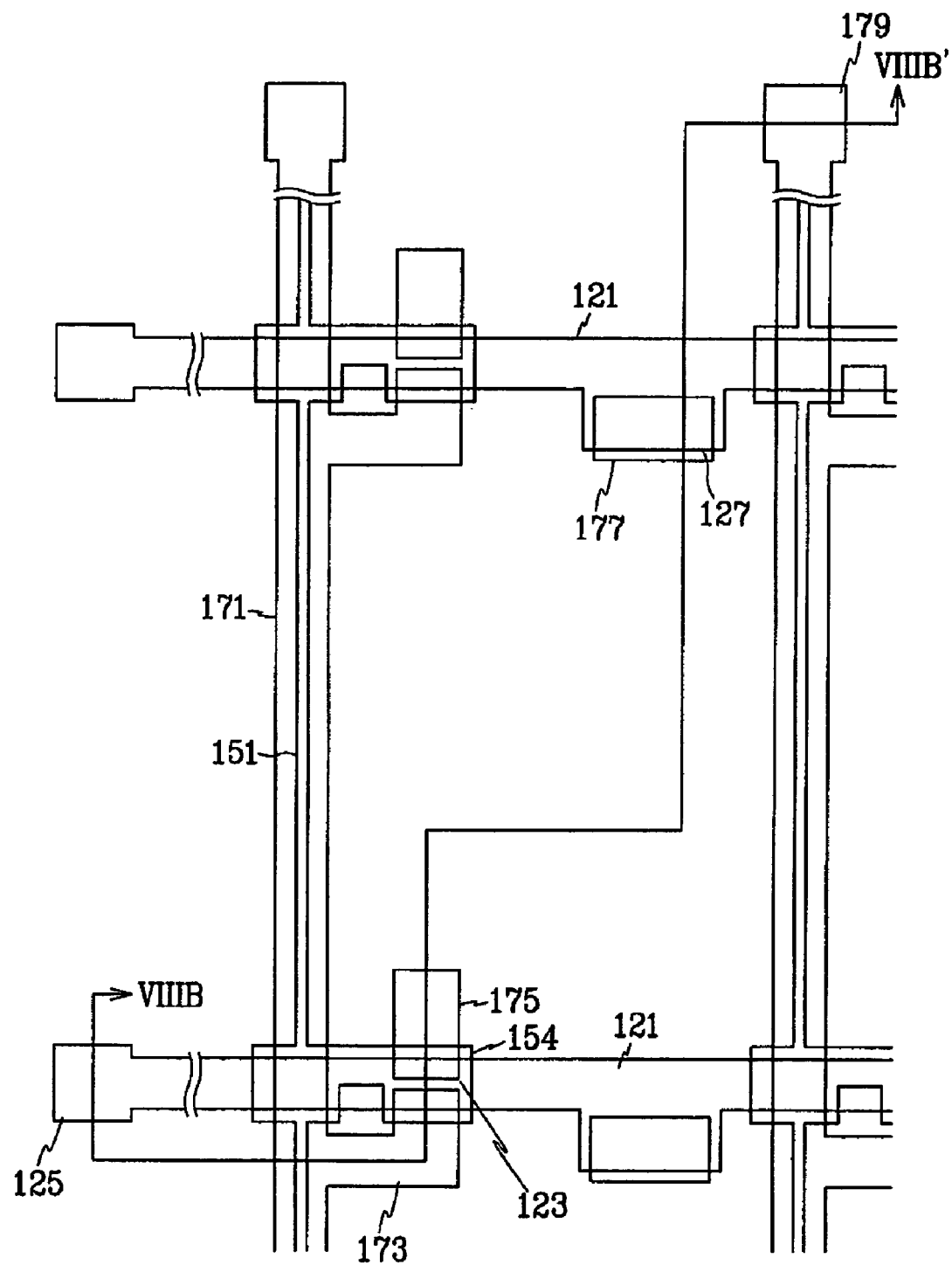
Figure 8B:
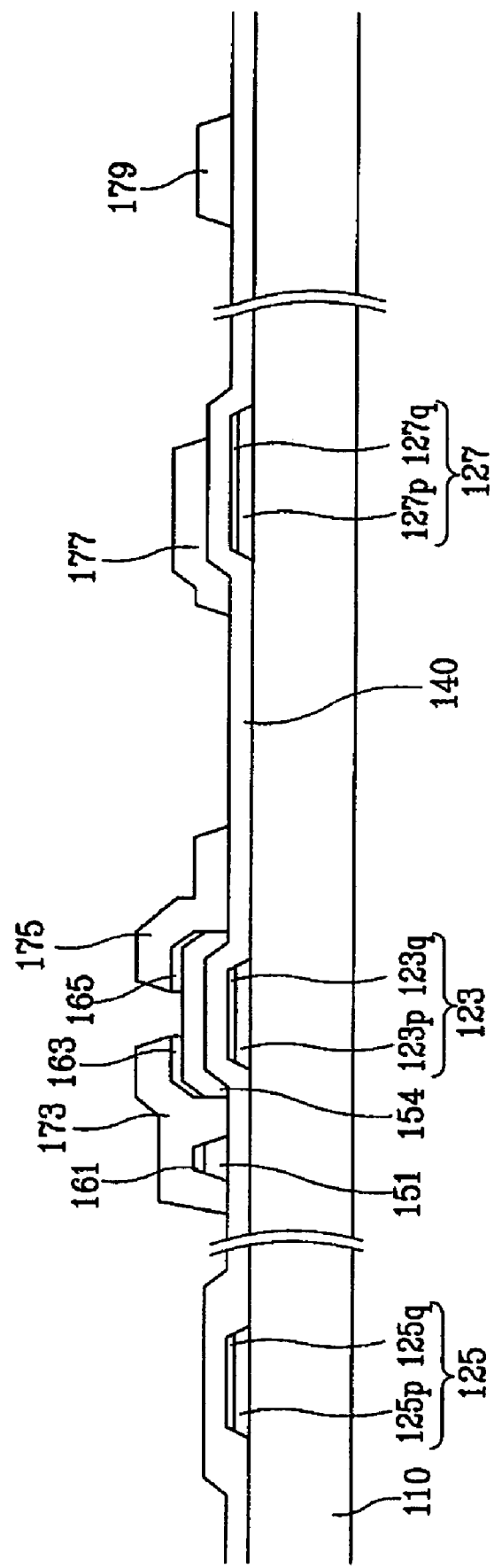

Referring to FIGS. 8A and 8B, a conductive film made of Mo—W alloy and having a thickness of about 1,500-3,000 Å, preferably 2,000 Å, is deposited and wet-etched with the etchant used for patterning the gate lines 121 to form a plurality of data lines 171 including a plurality of source electrodes 173 and a plurality of expansions 179, a plurality of drain electrodes 175, and a plurality of storage capacitor conductors 177.

Thereafter, portions of the extrinsic semiconductor stripes 164, which are not covered with the data lines 171, the drain electrodes 175, and the storage capacitor conductors 177, are removed to complete a plurality of ohmic contact stripes 161 including a plurality of projections 163 and a plurality of ohmic contact islands 165 and to expose portions of the intrinsic semiconductor stripes 151. Oxygen plasma treatment preferably follows thereafter in order to stabilize the exposed surfaces of the semiconductor stripes 151.

Figure 9A:
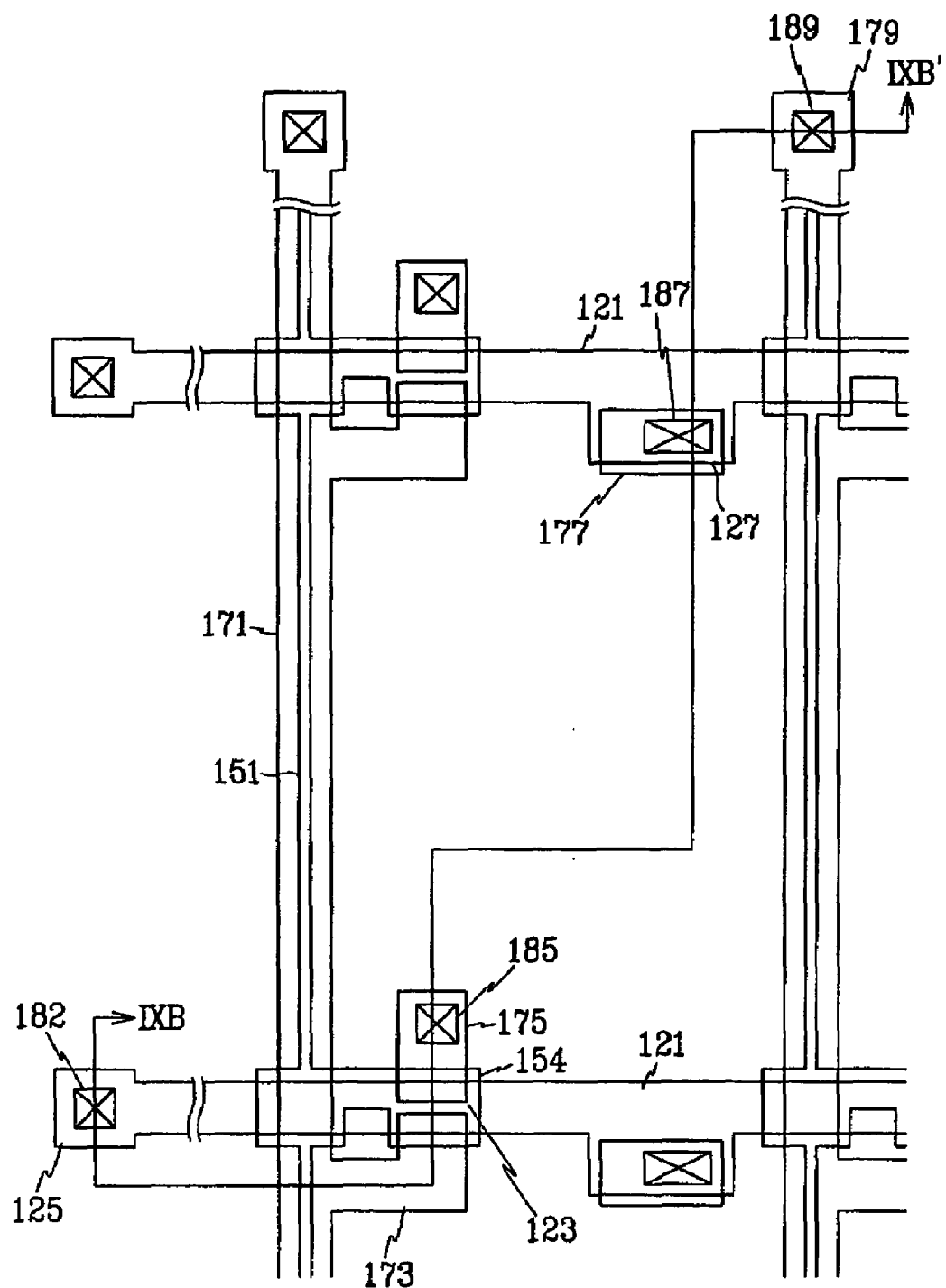
Figure 9B:
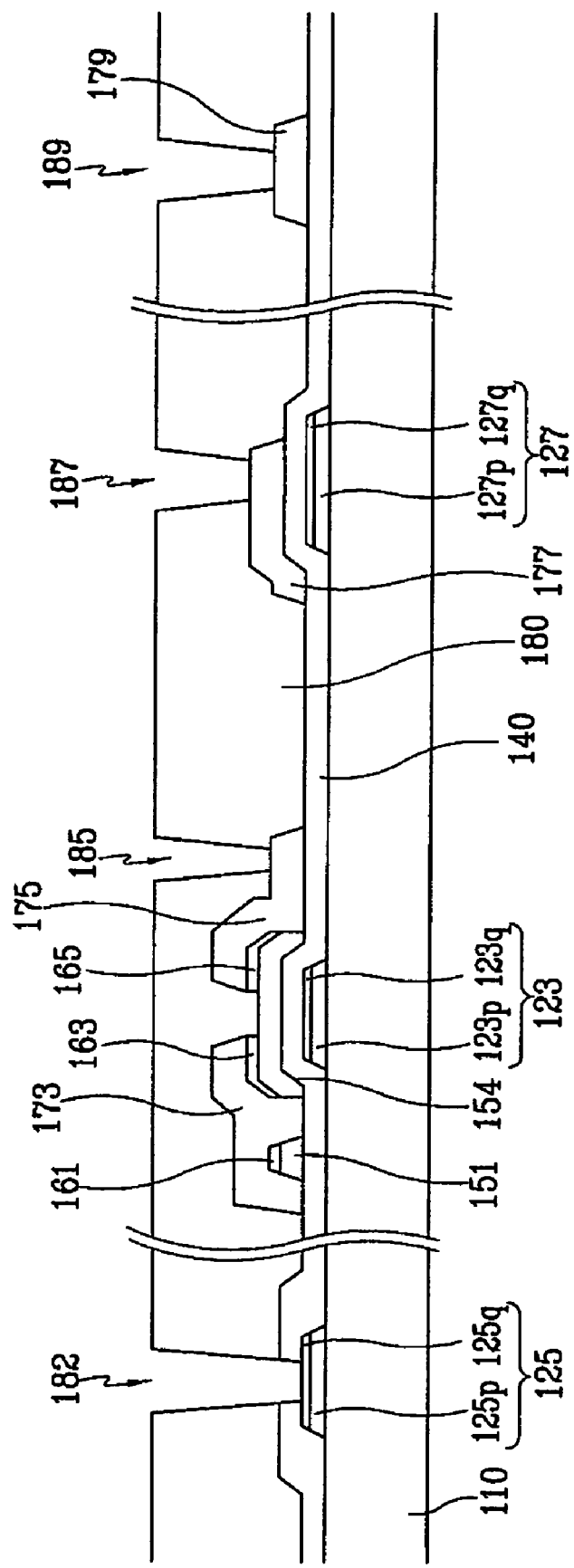

Next, a passivation layer 180 is formed by depositing silicon nitride, by PECVD of low dielectric material such as a-Si:C:O or a-Si:O:F, or by coating a photosensitive organic insulating material having a good planarization characteristic. Referring to FIGS. 9A and 9B, the passivation layer 180 as well as the gate insulating layer 140 is photo-etched to form a plurality of contact holes 182, 185, 187 and 189 exposing the expansions 125 of the gate lines 121, the drain electrodes 175, the storage capacitor conductors 177, and the expansions 179 of the data lines 171.

Finally, as shown in FIGS. 4 and 5, a plurality of pixel electrodes 190 and a plurality of contact assistants 92 and 97 are formed on the passivation layer 180 by sputtering and photo-etching an IZO layer having a thickness of about 800-1,000 Å, preferably about 900 Å with the etchant used for etching the gate lines 121 and the data lines 175.

In the manufacturing method of the TFT array panel according to this embodiment, the gate lines 121, the data lines 171, and the pixel electrodes 190 are etched by using a single etchant. Accordingly, the manufacturing method and apparatus are simplified, thereby reducing the manufacturing cost.

A TFT array panel for an LCD according to another embodiment of the present invention will be described in detail with reference to FIGS. 10-12.

Figure 10:
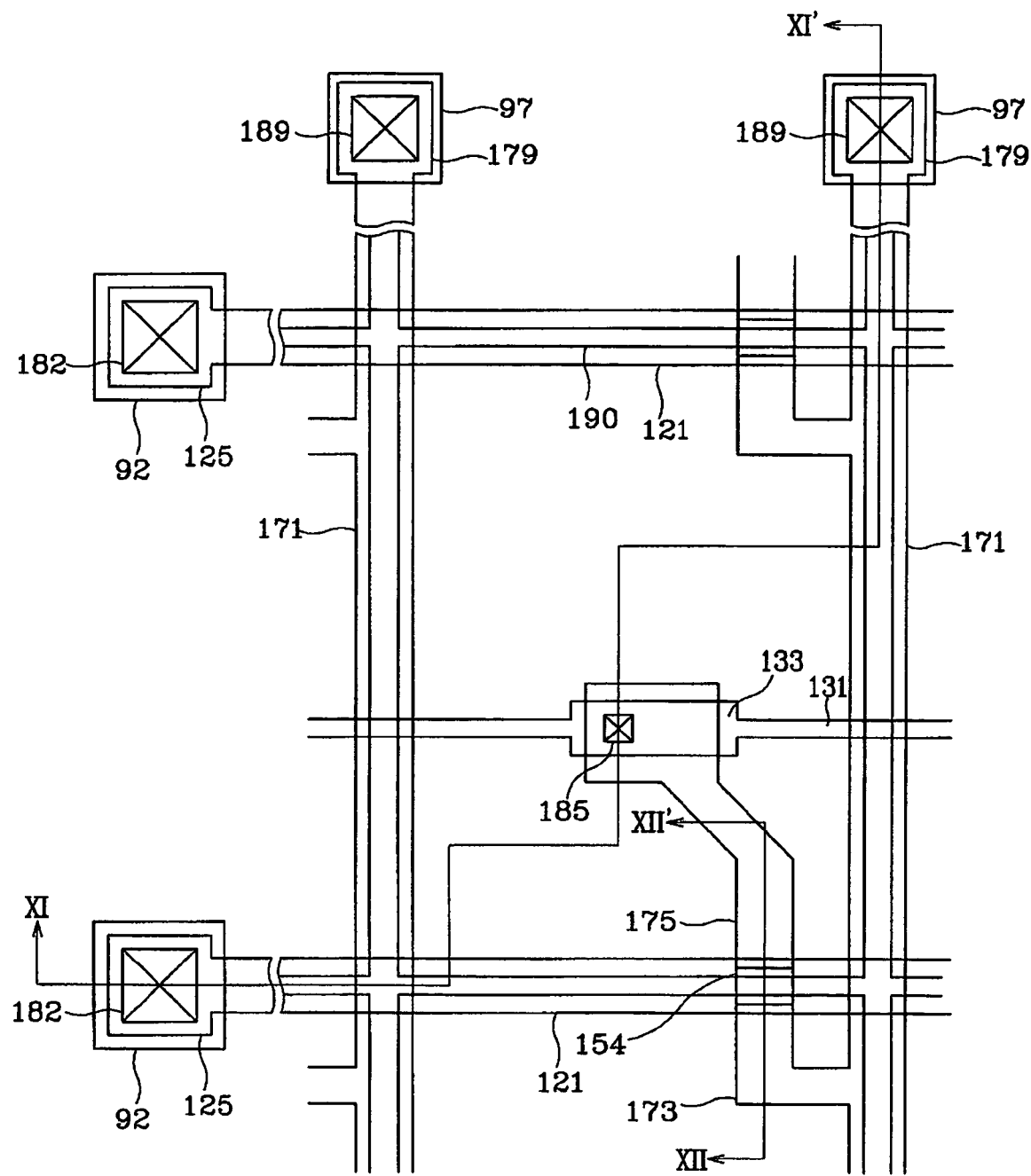
FIG. 10 is a layout view of an exemplary TFT array panel for an LCD according to another embodiment of the present invention.
Figure 11:
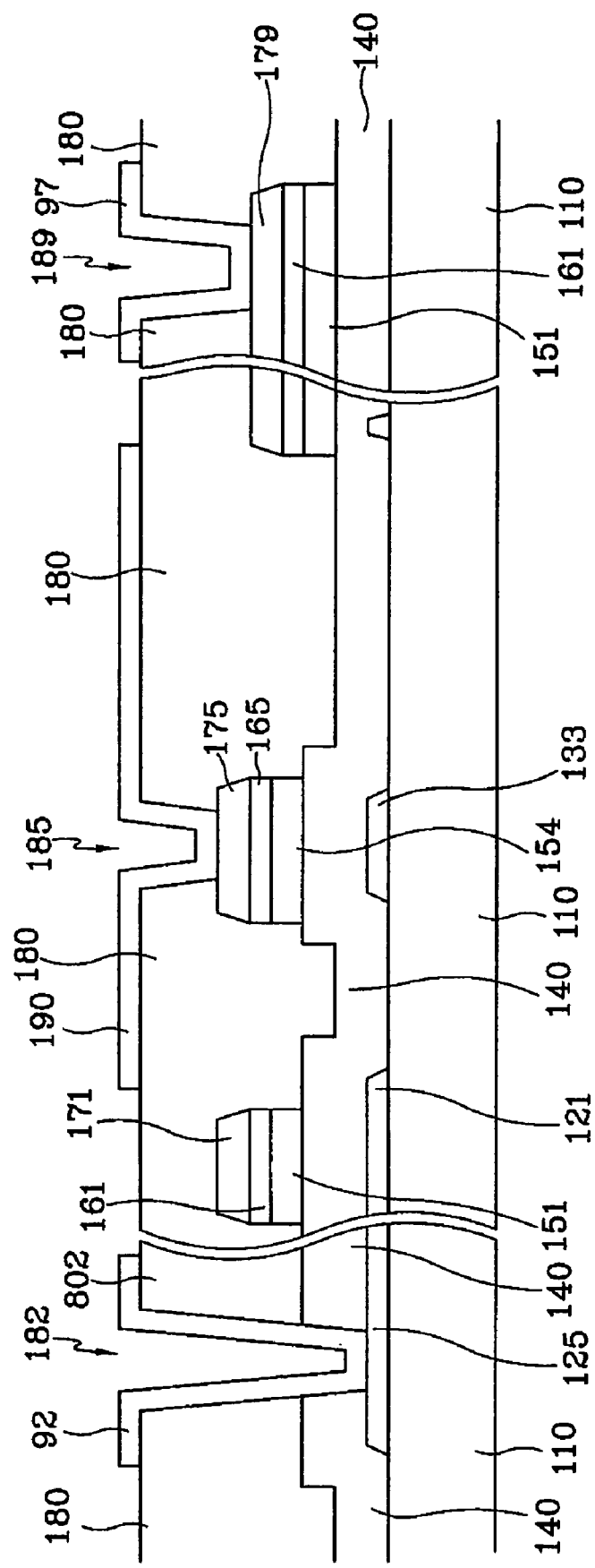
FIGS. 11 and 12 are sectional views of the TFT array panel shown in FIG. 10 taken along the line XI-XI' and the line XII-XII', respectively.
Figure 12:
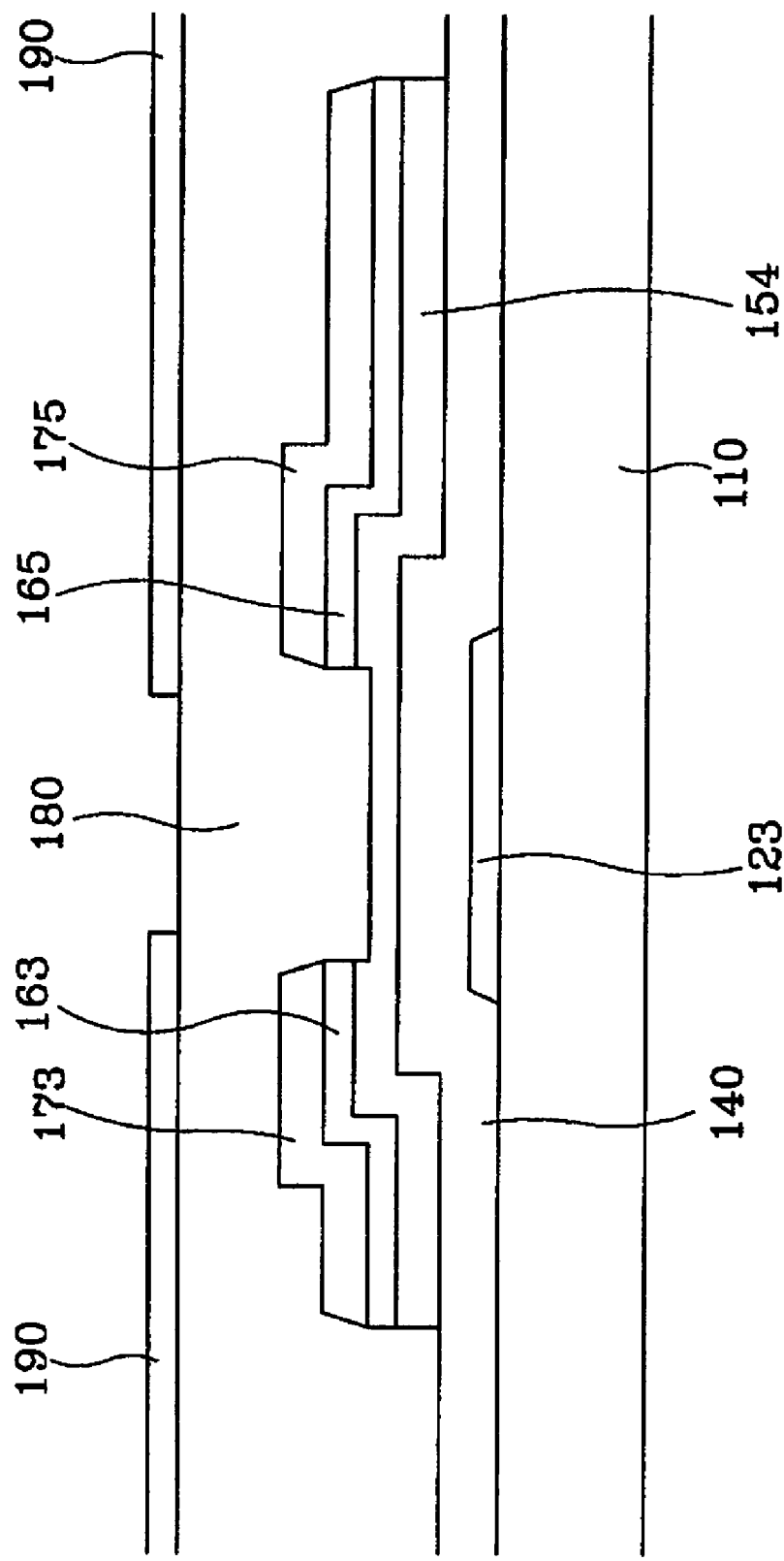

FIG. 10 is a layout view of an exemplary TFT array panel for an LCD according to another embodiment of the present invention, and FIGS. 11 and 12 are sectional views of the TFT array panel shown in FIG. 10 taken along the line XI-XI' and the line XII-XII', respectively.

As shown in FIGS. 10-12, a layered structure of a TFT array panel of an LCD according to this embodiment is almost the same as that shown in FIGS. 4 and 5. That is, a plurality of gate lines 121 including a plurality of gate electrodes 123 are formed on a substrate 110, and a gate insulating layer 140, a plurality of semiconductor stripes 151 including a plurality of projections 154, and a plurality of ohmic contact stripes 161 including a plurality of projections 163 and a plurality of ohmic contact islands 165 are sequentially formed thereon. A plurality of data lines 171 including a plurality of source electrodes 173 and a plurality of drain electrodes 175 are formed on the ohmic contacts 161 and 165, and a passivation layer 180 is formed thereon. A plurality of contact holes 182, 185 and 189 are provided at the passivation layer 180 and/or the gate insulating layer 140, and a plurality of pixel electrodes 190 and a plurality of contact assistants 92 and 97 are formed on the passivation layer 180.

Different from the TFT array panel shown in FIGS. 4 and 5, the TFT array panel according to this embodiment provides a plurality of storage electrode lines 131, which are separated from the gate lines 121 and have a plurality of expansions 133, on the same layer as the gate lines 121 without projections. The storage electrode lines 131 are supplied with a predetermined voltage such as the common voltage. Without providing the storage capacitor conductors 177 shown in FIGS. 4 and 5, the drain electrodes 175 extend to overlap the storage electrode lines 131 to form storage capacitors. The storage electrode lines 131 may be omitted if the storage capacitance generated by the overlapping of the gate lines 121 and the pixel electrodes 190 is sufficient. The positions of the storage electrode lines 131 may be changed, and, for example, the storage electrode lines 131 are disposed near the edges of the pixel electrodes 190 in consideration of the aperture ratio.

Furthermore, the gate lines 125 and the storage electrode lines 131 have a single layered structure.

The semiconductor stripes 151 have almost the same planar shapes as the data lines 171 and the drain electrodes 175 as well as the underlying ohmic contacts 161 and 165, except for the projections 154 where TFTs are provided. That is, the semiconductor stripes 151 include some exposed portions, which are not covered with the data lines 171 and the drain electrodes 175, such as portions located between the source electrodes 173 and the drain electrodes 175.

Now, a method of manufacturing the TFT array panel shown in FIGS. 10-12 according to an embodiment of the present invention will be described in detail with reference to FIGS. 13A-19C as well as FIGS. 10-12.

Figure 13A:
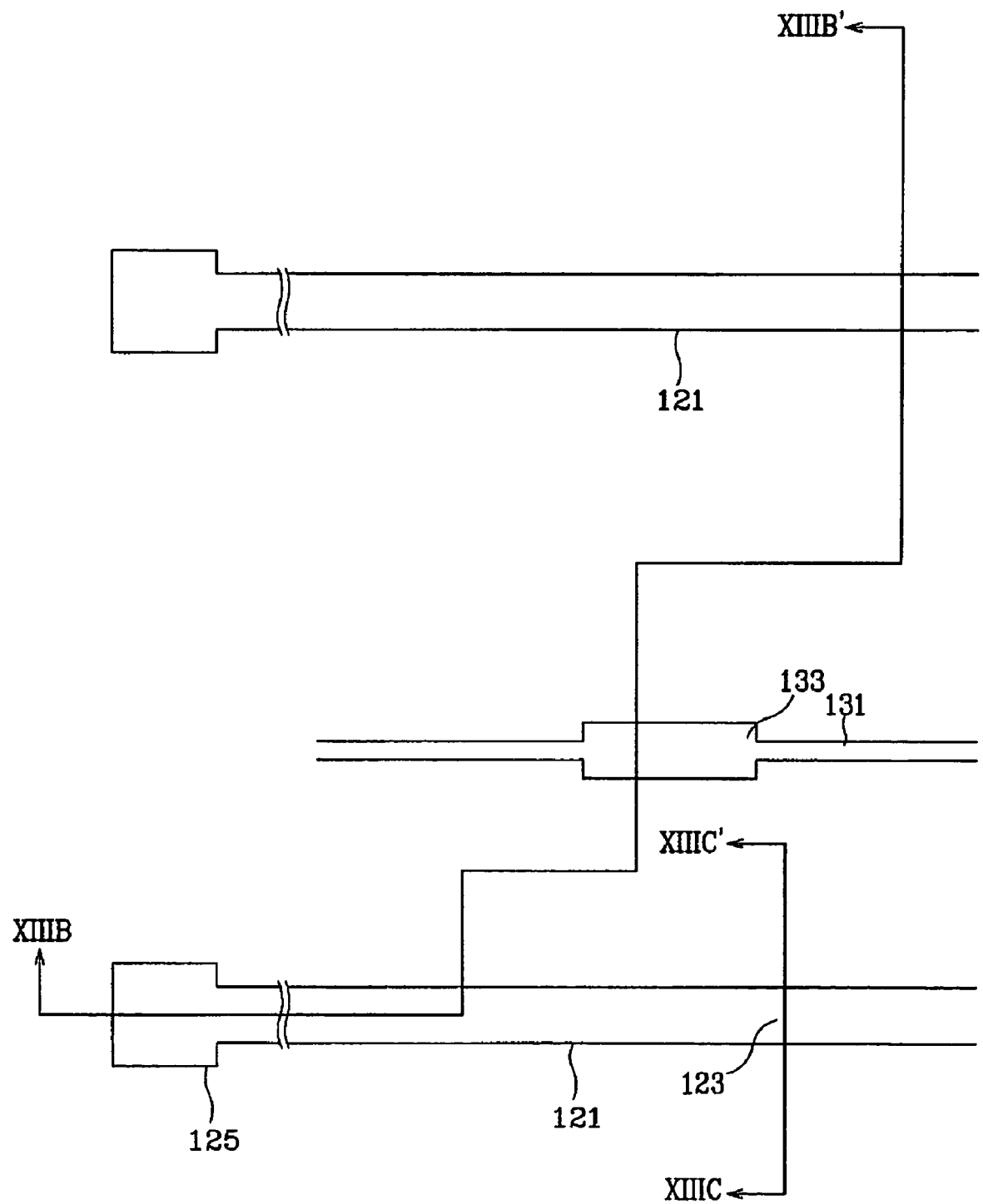
FIG. 13A is a layout view of a TFT array panel shown in FIGS. 10-12 in the first step of a manufacturing method thereof according to an embodiment of the present invention.
Figure 13B:
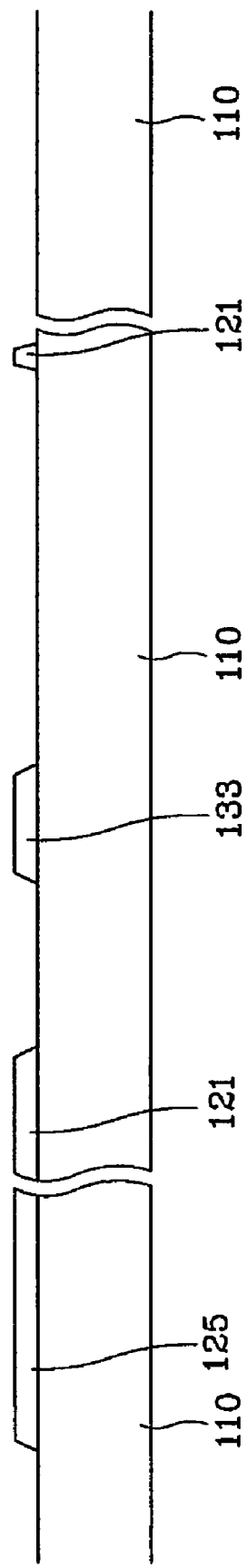
Figure 14A:
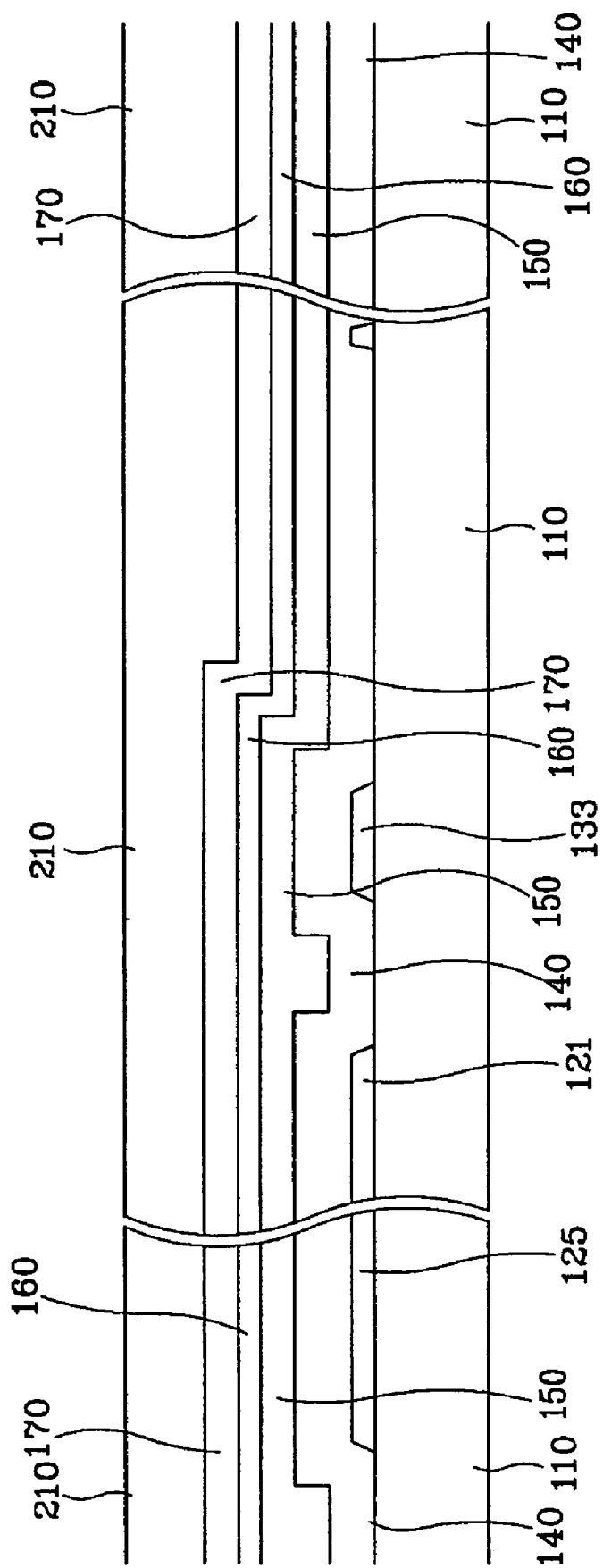
FIGS. 14A and 14B are sectional views of the TFT array panel shown in FIG. 13A taken along the lines XIIIB-XIIIB' and XIIIC-XIIIC', respectively, and illustrate the step following the step shown in FIGS. 13B and 13C.
Figure 14B:
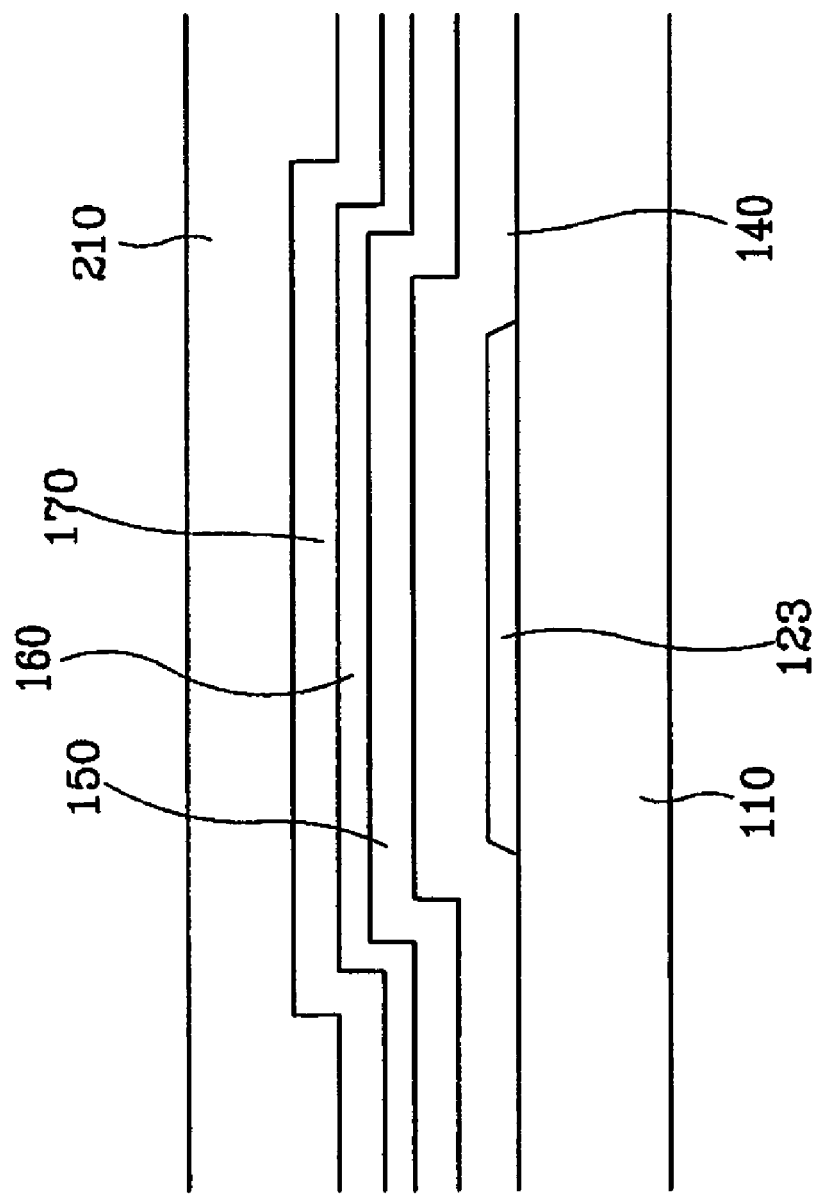
Figure 15A:
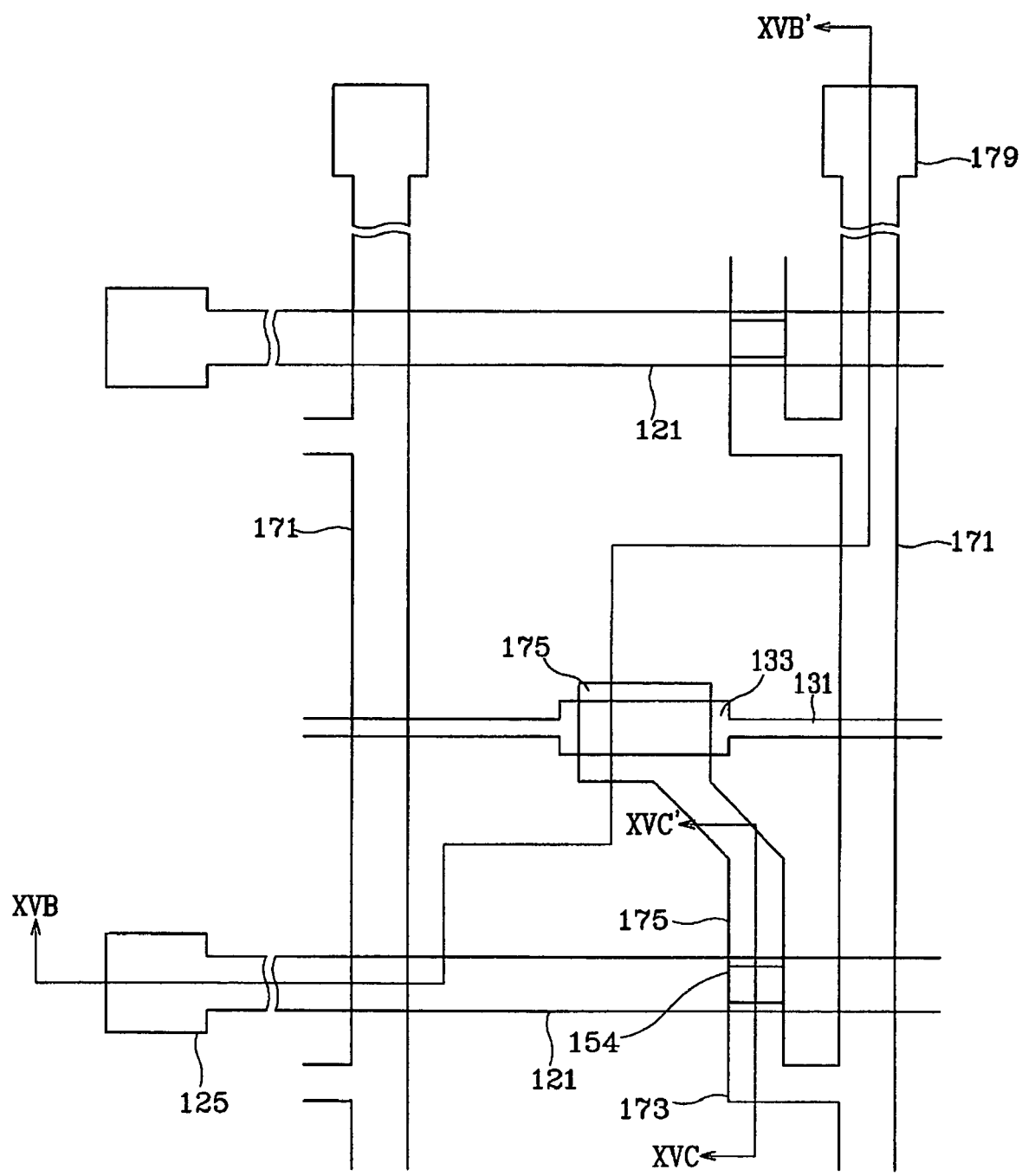
FIG. 15A is a layout view of the TFT array panel in the step following the step shown in FIGS. 14A and 14B.
Figure 15B:
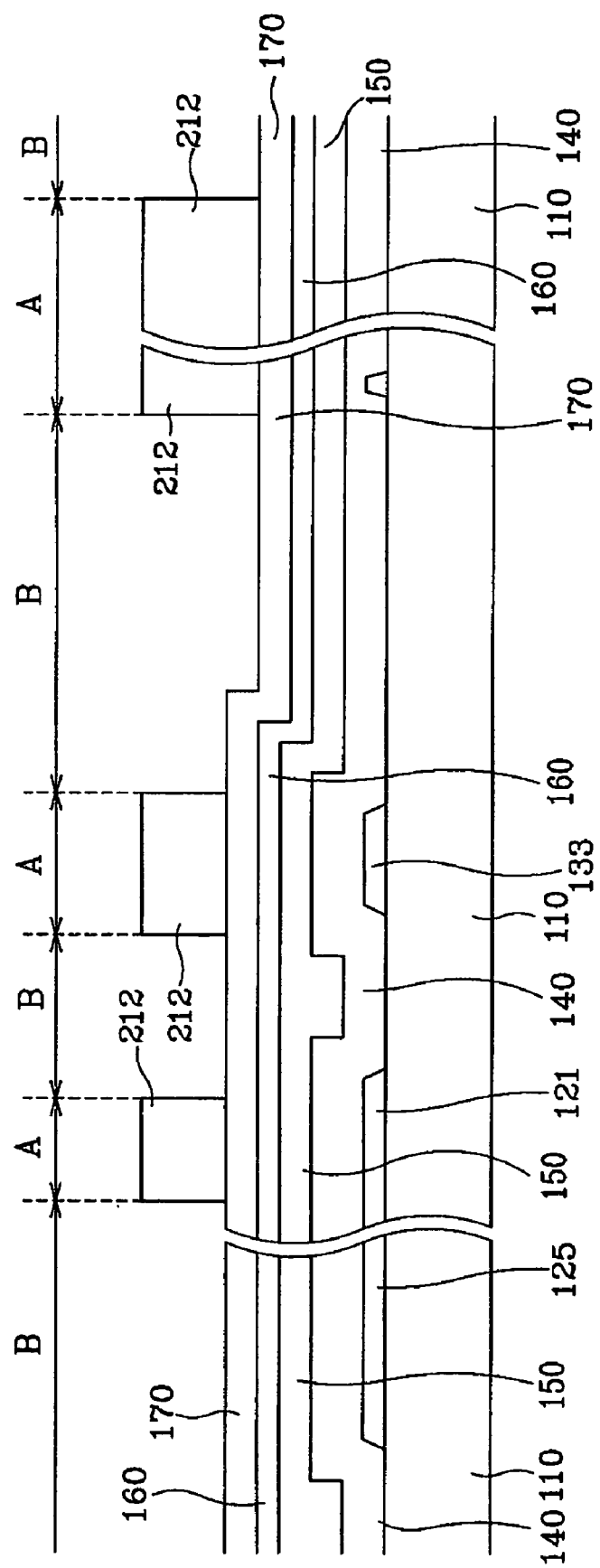
FIGS. 15B and 15C are sectional views of the TFT array panel shown in FIG. 15A taken along the lines XVB-XVB' and XVC-XVC', respectively.
Figure 15C:
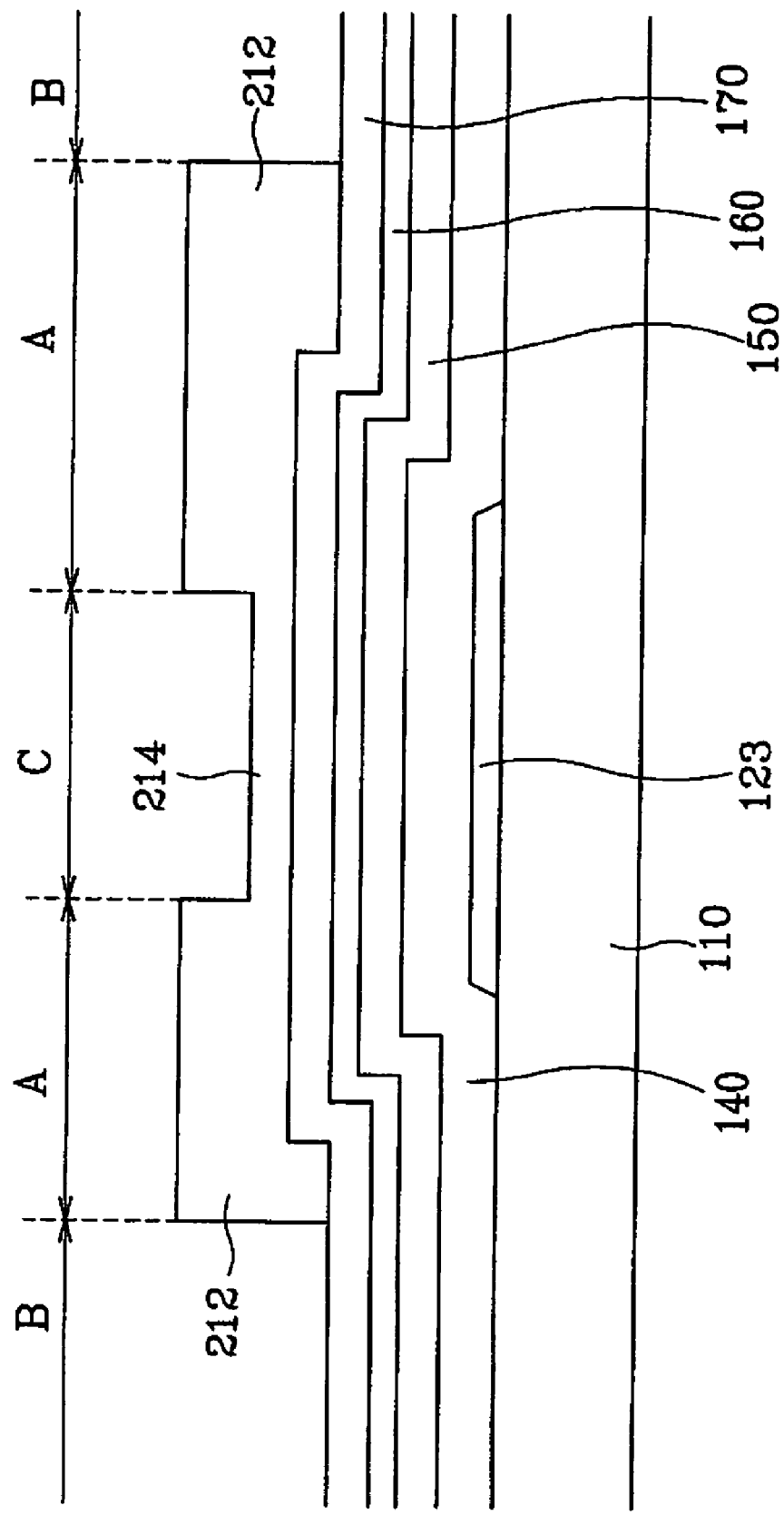

FIG. 13A is a layout view of a TFT array panel shown in FIGS. 10-12 in the first step of a manufacturing method thereof according to an embodiment of the present invention; FIGS. 13B and 13C are sectional views of the TFT array panel shown in FIG. 13A taken along the lines XIIIB-XIIIB' and XIIIC-XIIIC', respectively; FIGS. 14A and 14B are sectional views of the TFT array panel shown in FIG. 13A taken along the lines XIIIB-XIIIB' and XIIIC-XIIIC', respectively, and illustrate the step following the step shown in FIGS. 13B and 13C; FIG. 15A is a layout view of the TFT array panel in the step following the step shown in FIGS. 14A and 14B; FIGS. 15B and 15C are sectional views of the TFT array panel shown in FIG. 15A taken along the lines XVB-XVB' and XVC-XVC', respectively; FIGS. 16A, 17A and 18A and FIGS. 16B, 17B and 18B are respective sectional views of the TFT array panel shown in FIG. 15A taken along the lines XVB-XVB' and XVC-XVC', respectively, and illustrate the steps following the step shown in FIGS. 15B and 15C; FIG. 19A is a layout view of a TFT array panel in the step following the step shown in FIGS. 18A and 18B; and FIGS. 19B and 19C are sectional views of the TFT array panel shown in FIG. 19A taken along the lines XIXB-XIXB' and XIXC-XIXC', respectively.

Referring to FIGS. 13A-13C, a plurality of gate lines 121 including a plurality of gate electrodes 123 and a plurality of storage electrode lines 131 are formed on a substrate 110 by photo etching using an etchant. The etchant about 50-60% $H_3PO_4$, about 6-10% $HNO_3$, about 15-25% $CH_3COOH$, about 2-5% stabilizer, and deionized water. The stabilizer includes oxy-hydride inorganic acid represented by $M(OH)_X L_Y$, where M is Zn, Sn, Cr, Al, Ba, Fe, Ti, Si or B, L is $H_2O$, $NH_3$, CN or $NH_2R$ (where R is alkyl group), X is 2 or 3, and Y is 0, 1, 2 or 3.

As shown in FIGS. 14A and 14B, a gate insulating layer 140, an intrinsic a-Si layer 150, and an extrinsic a-Si layer 160 are sequentially deposited by CVD such that the layers 140, 150 and 160 have thickness of about 1,500-5,000 Å, about 500-2,000 Å and about 300-600 Å, respectively. A conductive layer 170 having a thickness of about 1,500-3,000 Å and made of Mo or Mo alloy such as MoW is deposited by sputtering, and a photoresist film 210 with the thickness of about 1-2 microns is coated on the conductive layer 170.

The photoresist film 210 is exposed to light through an exposure mask (not shown), and developed such that the developed photoresist has a position dependent thickness. The photoresist shown in FIGS. 15B and 15C includes a plurality of first to third portions with decreased thickness. The first portions located on wire areas A and the second portions located on channel areas C are indicated by reference numerals 212 and 214, respectively, and no reference numeral is assigned to the third portions located on remaining areas B since they have substantially zero thickness to expose underlying portions of the conductive layer 170. The thickness ratio of the second portions 214 to the first portions 212 is adjusted depending upon the process conditions in the subsequent process steps. It is preferable that the thickness of the second portions 214 is equal to or less than half of the thickness of the first portions 212, and in particular, equal to or less than 4,000 Å.

The position-dependent thickness of the photoresist is obtained by several techniques, for example, by providing translucent areas on the exposure mask 300 as well as transparent areas and light blocking opaque areas. The translucent areas may have a slit pattern, a lattice pattern, a thin film(s) with intermediate transmittance or intermediate thickness. When using a slit pattern, it is preferable that the width of the slits or the distance between the slits is smaller than the resolution of a light exposer used for the photolithography. Another example is to use reflowable photoresist. In detail, once a photoresist pattern made of a reflowable material is formed by using a normal exposure mask only with transparent areas and opaque areas, it is subject to reflow process to flow onto areas without the photoresist, thereby forming thin portions.

The different thickness of the photoresist 212 and 214 enables to selectively etch the underlying layers when using suitable process conditions. Therefore, a plurality of data lines 171 including a plurality of source electrodes 173 and a plurality of drain electrodes 175 as well as a plurality of ohmic contact stripes 161 including a plurality of projections 163, a plurality of ohmic contact islands 165 and a plurality of semiconductor stripes 151 including a plurality of projections 154 are obtained by a series of etching steps.

For descriptive purpose, portions of the conductive layer 170, the extrinsic a-Si layer 160, and the intrinsic a-Si layer 150 on the wire areas A are called first portions, portions of the conductive layer 170, the extrinsic a-Si layer 160, and the intrinsic a-Si layer 150 on the channel areas C are called second portions, and portions of the conductive layer 170, the extrinsic a-Si layer 160, and the intrinsic a-Si layer 150 on the remaining areas B are called third portions.

An exemplary sequence of forming such a structure is as follows:

(1) Removal of third portions of the conductive layer 170, the extrinsic a-Si layer 160 and the intrinsic a-Si layer 150 on the wire areas A;
(2) Removal of the second portions 214 of the photoresist;
(3) Removal of the second portions of the conductive layer 170 and the extrinsic a-Si layer 160 on the channel areas C; and
(4) Removal of the first portions 212 of the photoresist.

Another exemplary sequence is as follows:

(1) Removal of the third portions of the conductive layer 170;
(2) Removal of the second portions 214 of the photoresist;
(3) Removal of the third portions of the extrinsic a-Si layer 160 and the intrinsic a-Si layer 150;
(4) Removal of the second portions of the conductive layer 170;
(5) Removal of the first portions 212 of the photoresist; and
(6) Removal of the second portions of the extrinsic a-Si layer 160.

The first example is described in detail.

Figure 16A:
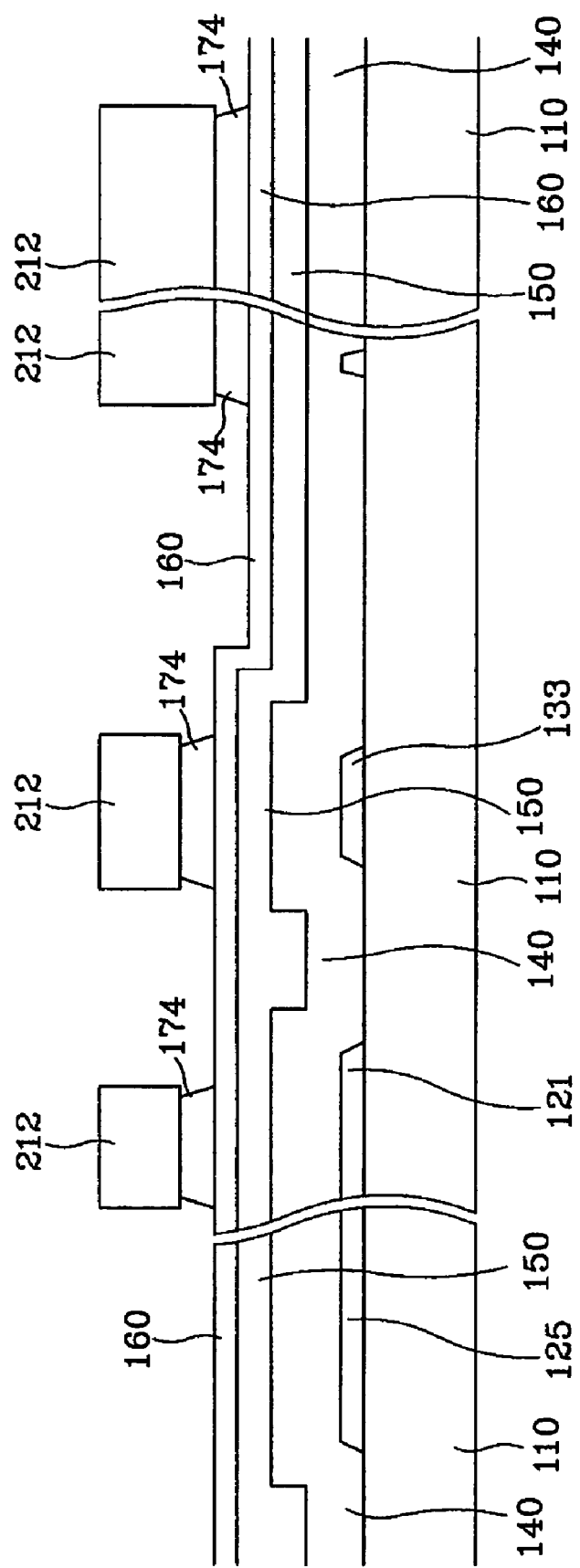
Figure 16B:
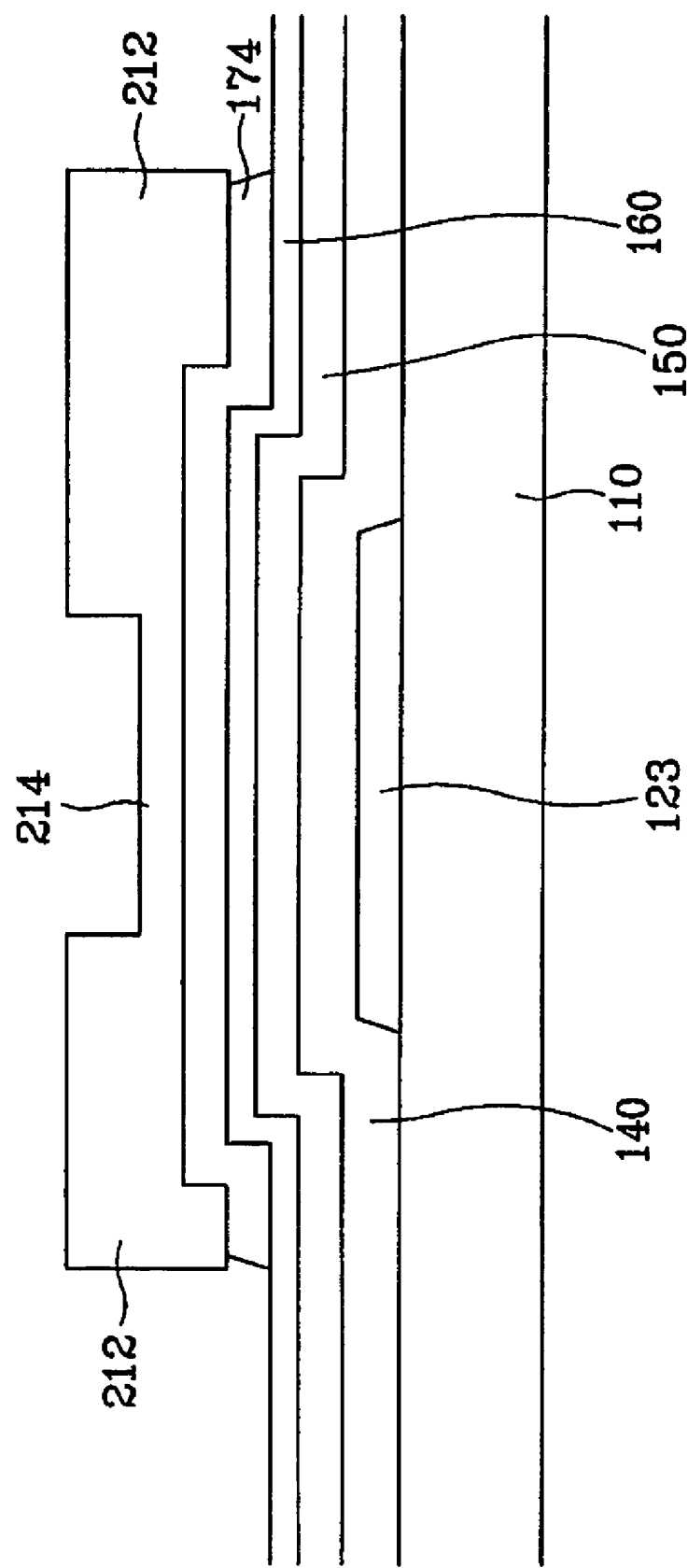

As shown in FIGS. 16A and 16B, the exposed third portions of the conductive layer 170 on the remaining areas B are removed by wet etching with the etchant used for the gate lines 121 and the storage electrode lines 131 to expose the underlying third portions of the extrinsic a-Si layer 160.

Reference numeral 174 indicates portions of the conductive layer 170 including the data lines 171 and the drain electrode 175 connected to each other. The dry etching may etch out the top portions of the photoresist 212 and 214.

Figure 17A:
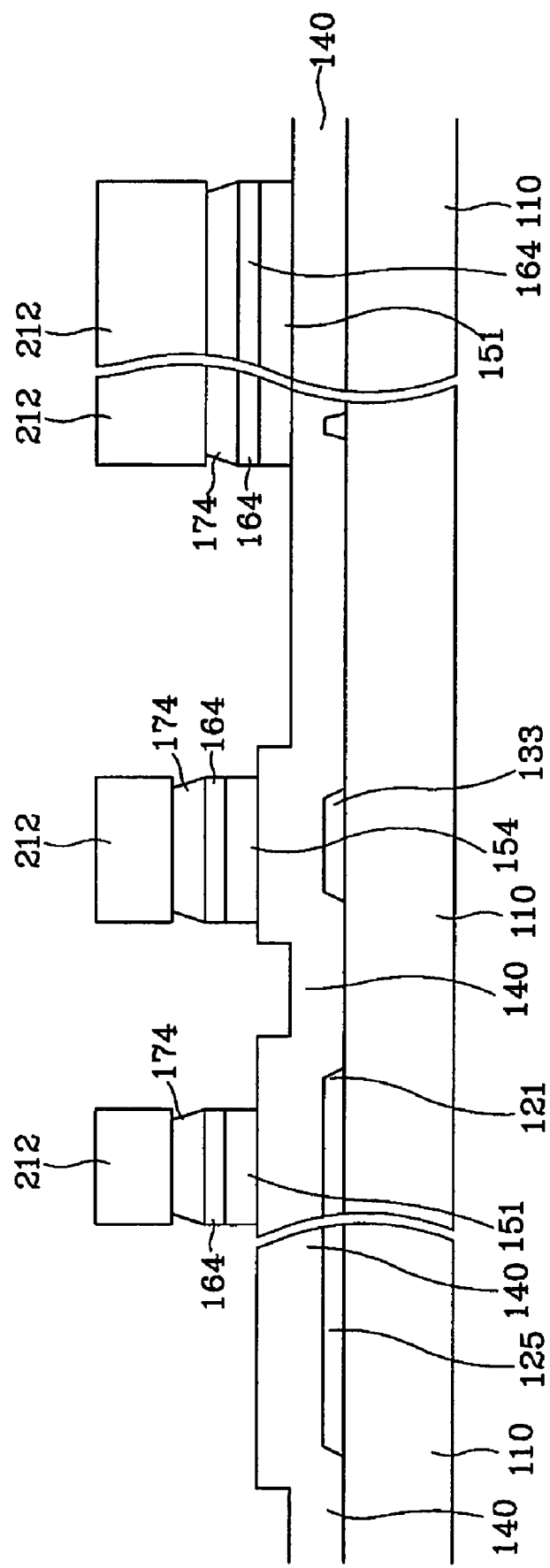

Referring to FIGS. 17A and 17B, the third portions of the extrinsic a-Si layer 160 on the areas B and of the intrinsic a-Si layer 150 are removed preferably by dry etching and the second portions 214 of the photoresist are removed to expose the second portions of the conductors 174. The removal of the second portions 214 of the photoresist are performed either simultaneously with or independent from the removal of the third portions of the extrinsic a-Si layer 160 and of the intrinsic a-Si layer 150. Residue of the second portions 214 of the photoresist remained on the channel areas C is removed by ashing.

The semiconductor stripes 151 are completed in this step, and reference numeral 164 indicates portions of the extrinsic a-Si layer 160 including the ohmic contact stripes and islands 161 and 165 connected to each other, which are called "extrinsic semiconductor stripes."

Figure 18A:
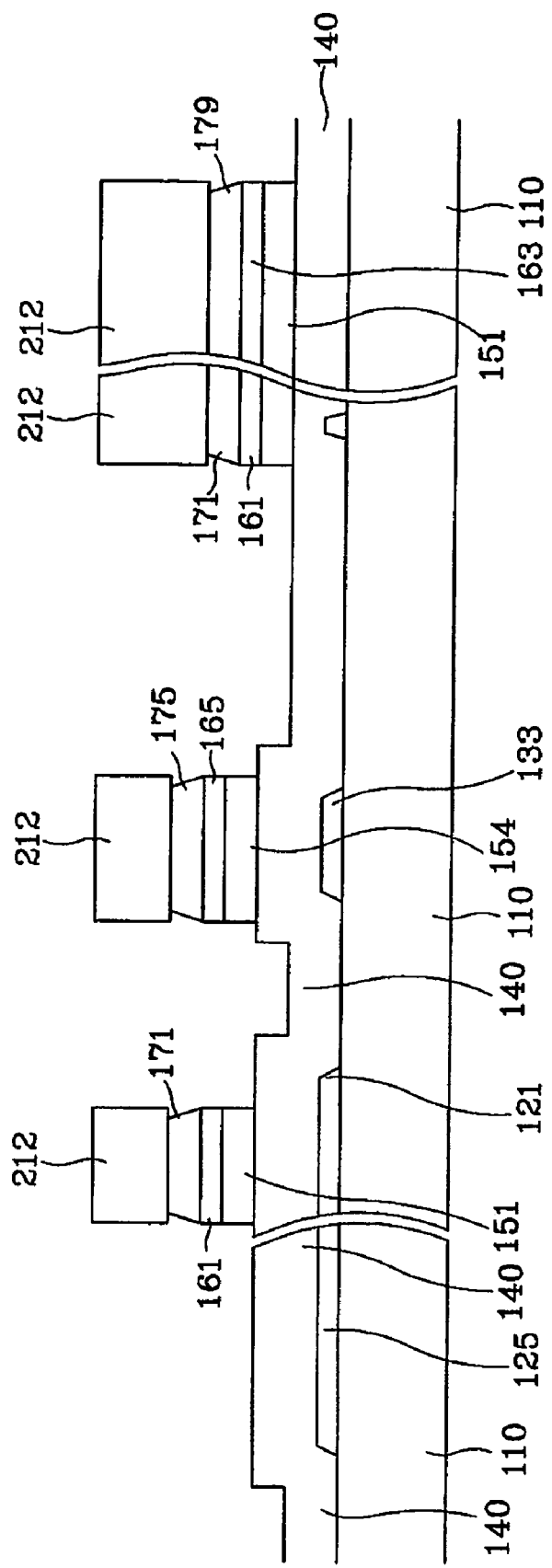
Figure 18B:
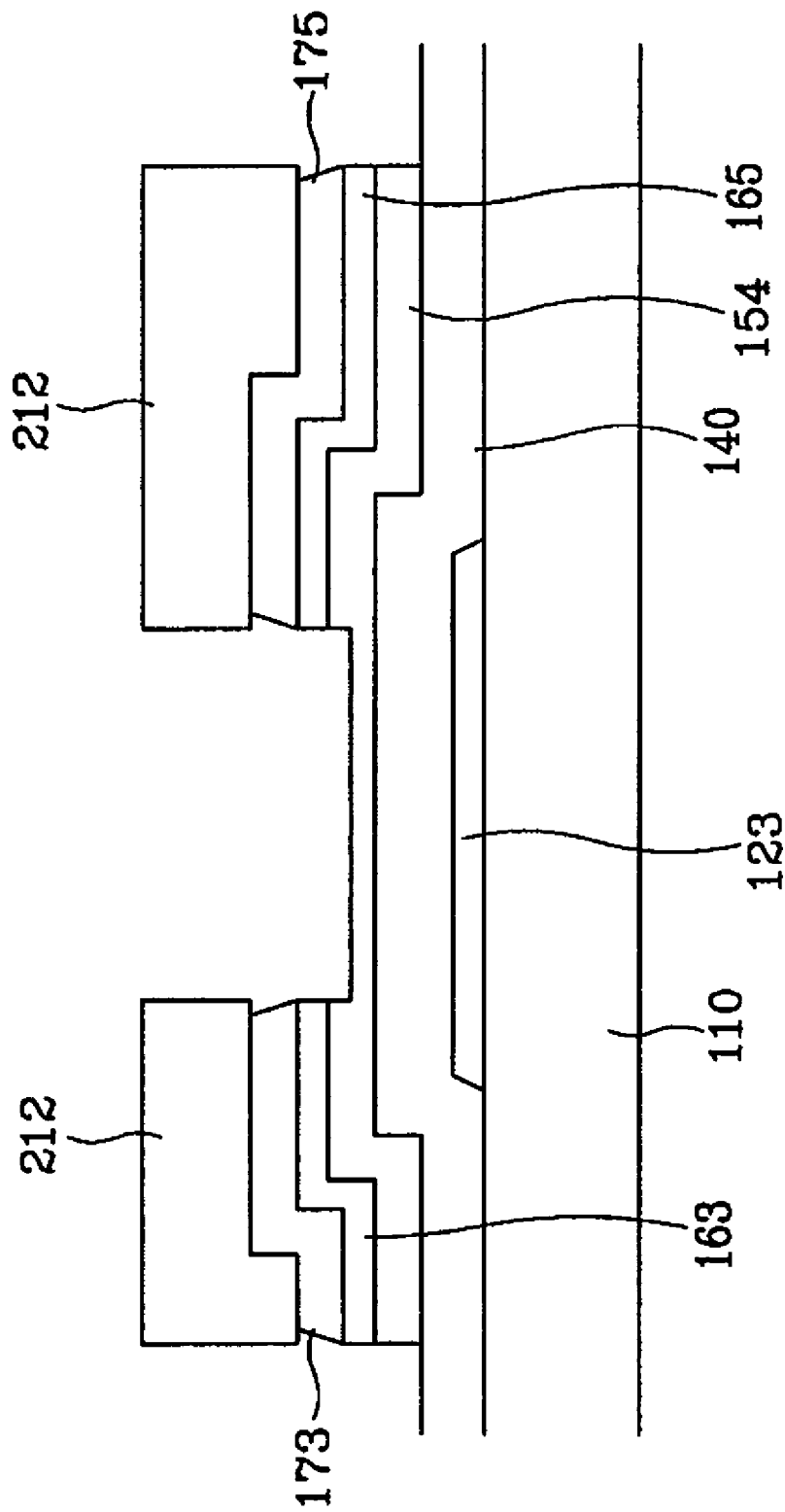
Figure 19A:
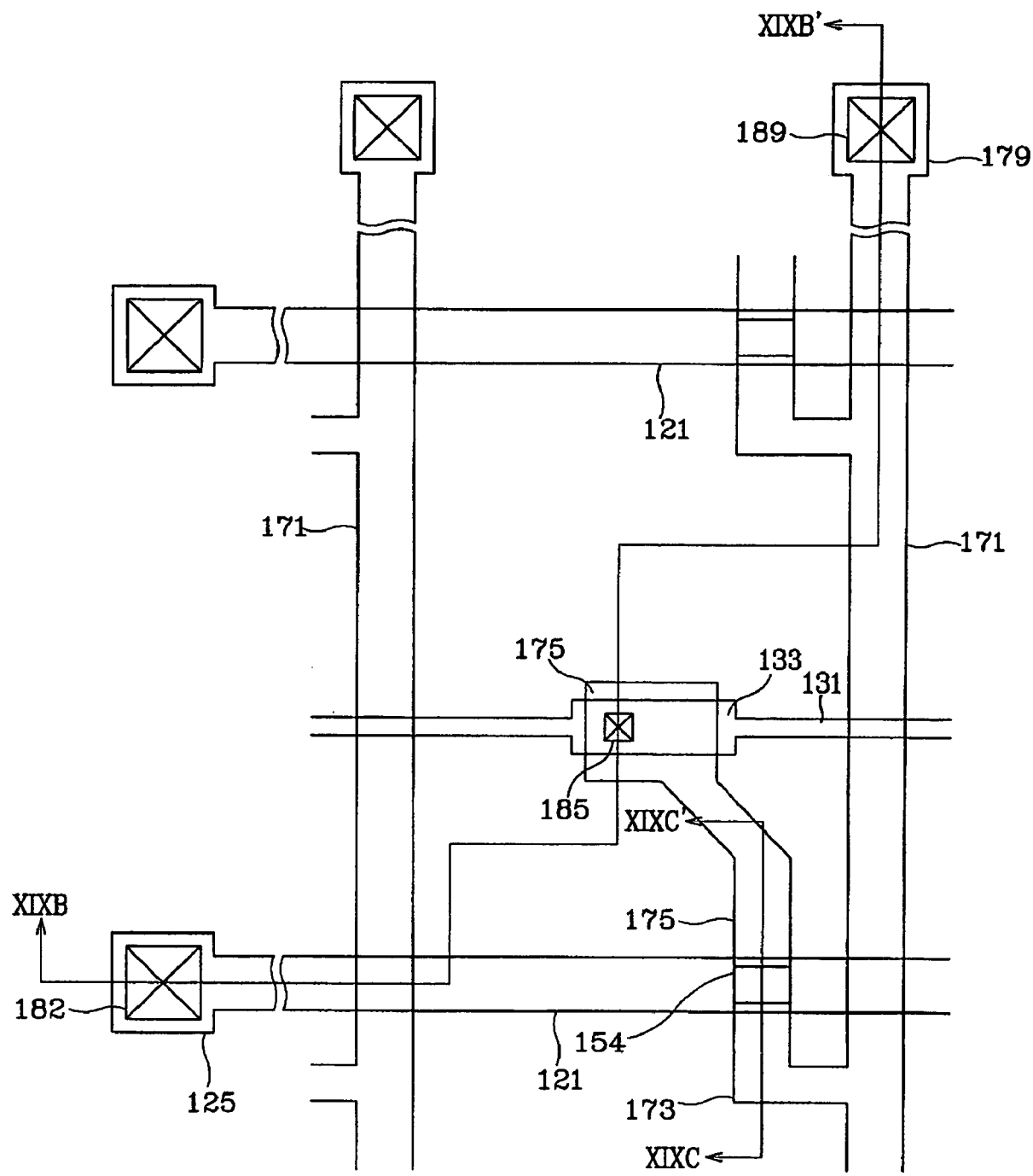
FIG. 19A is a layout view of a TFT array panel in the step following the step shown in FIGS. 18A and 18B.
Figure 19B:
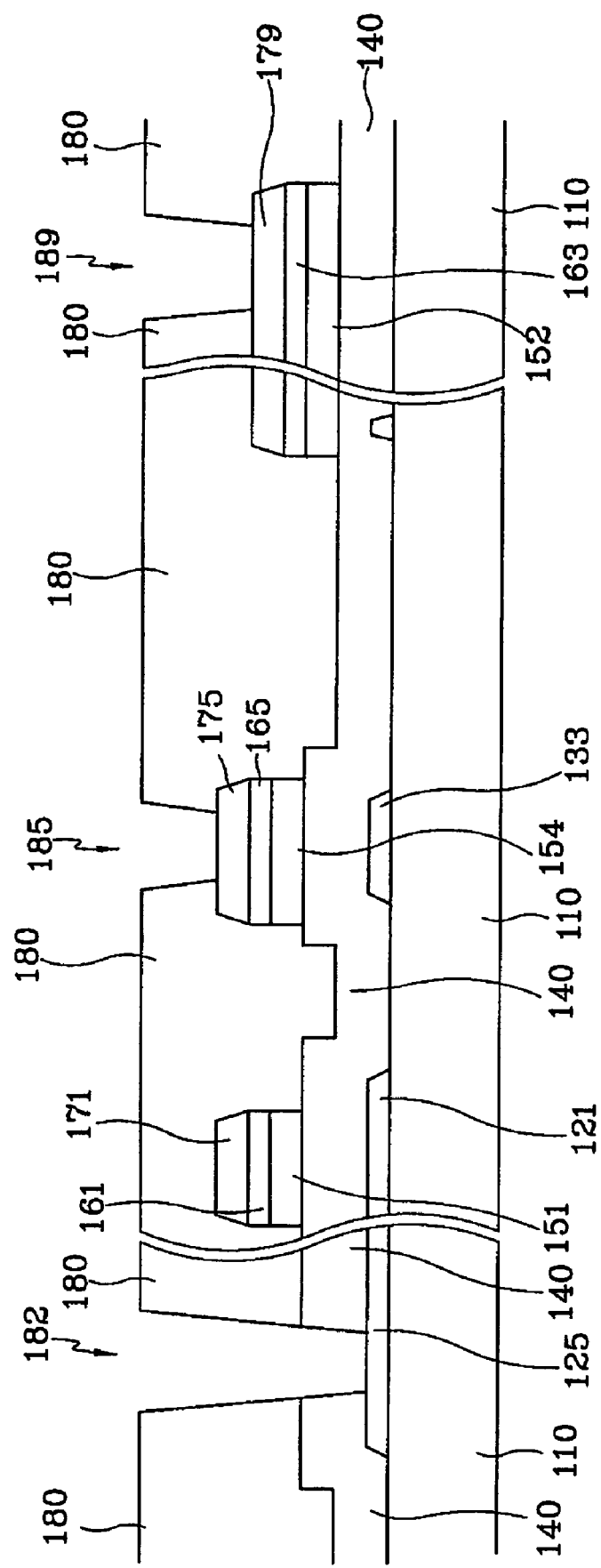

As shown in FIGS. 18A and 18B, the second portions of the conductors 174 and the extrinsic a-Si stripes 164 on the channel areas C as well as the first portion 212 of the photoresist are removed.

As shown in FIG. 18B, top portions of the projections 154 of the intrinsic semiconductor stripes 151 on the channel areas C may be removed to cause thickness reduction, and the first portions 212 of the photoresist are etched to a predetermined thickness.

In this way, each conductor 174 is divided into a data line 171 and a plurality of drain electrodes 175 to be completed, and each extrinsic semiconductor stripe 164 is divided into an ohmic contact stripe 161 and a plurality of ohmic contact islands 165 to be completed.

As shown in FIGS. 19A-19C, a passivation layer 180 is deposited and patterned to form a plurality of contact holes 182, 185 and 189 exposing expansions 125 of the gate lines 121, the drain electrodes 175, and expansions of the data lines 171.

Finally, as shown in FIGS. 10-12, an IZO layer with a thickness in a range between about 500 Å and about 1,000 Å is sputtered and photo-etched using the etchant used for the gate lines 121 and the data lines 171 to form a plurality of pixel electrodes 190 and a plurality of contact assistants 92 and 97.

This embodiment simplifies the manufacturing process by forming the data lines 171 and the drain electrodes 175 as well as the ohmic contacts 161 and 165 and the semiconductor stripes 151 and using a single photolithography step.

A TFT array panel for an LCD according to another embodiment of the present invention will be described in detail with reference to FIGS. 20 and 21.

Figure 20:
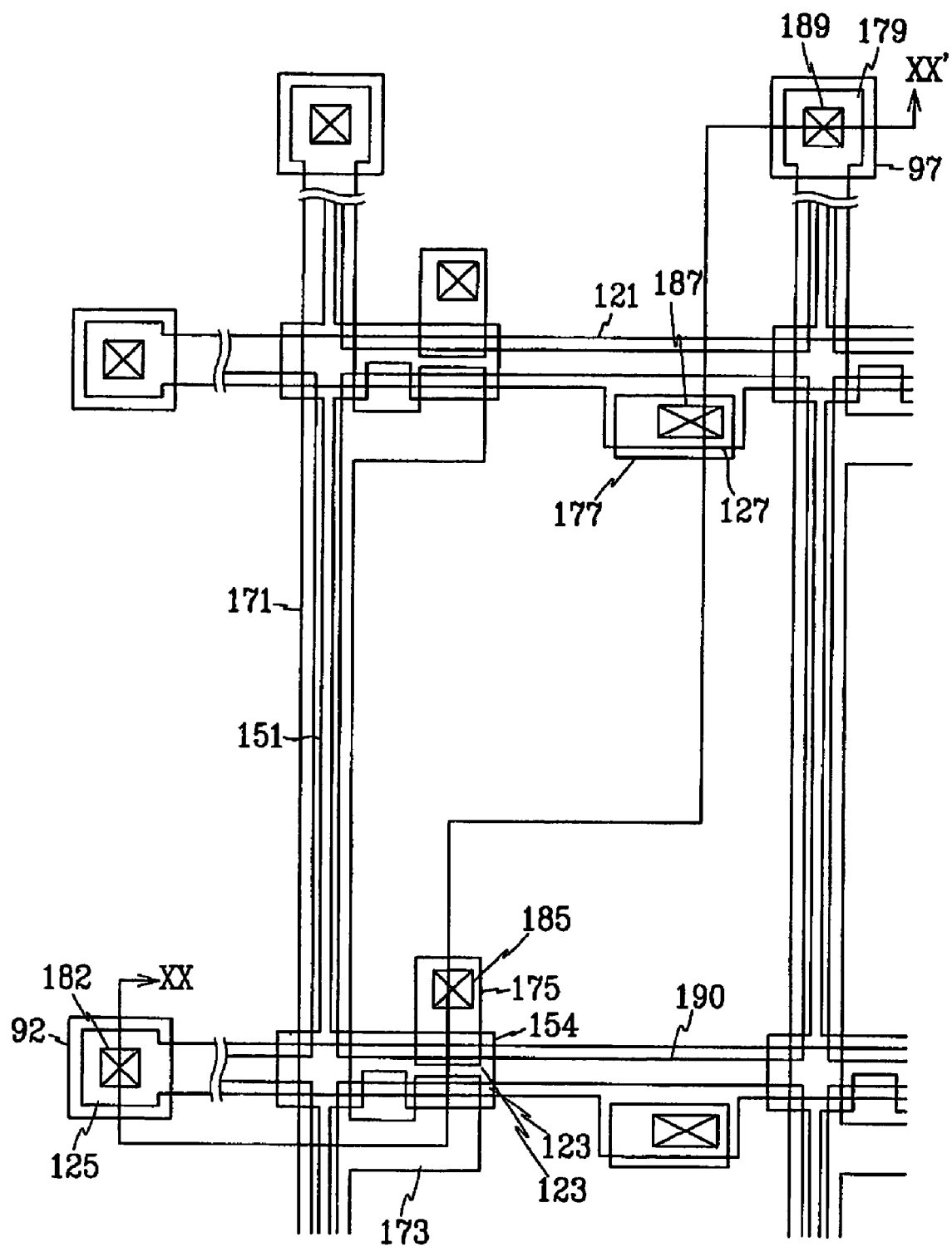
FIG. 20 is a layout view of an exemplary TFT array panel for an LCD according to another embodiment of the present invention.
Figure 21:
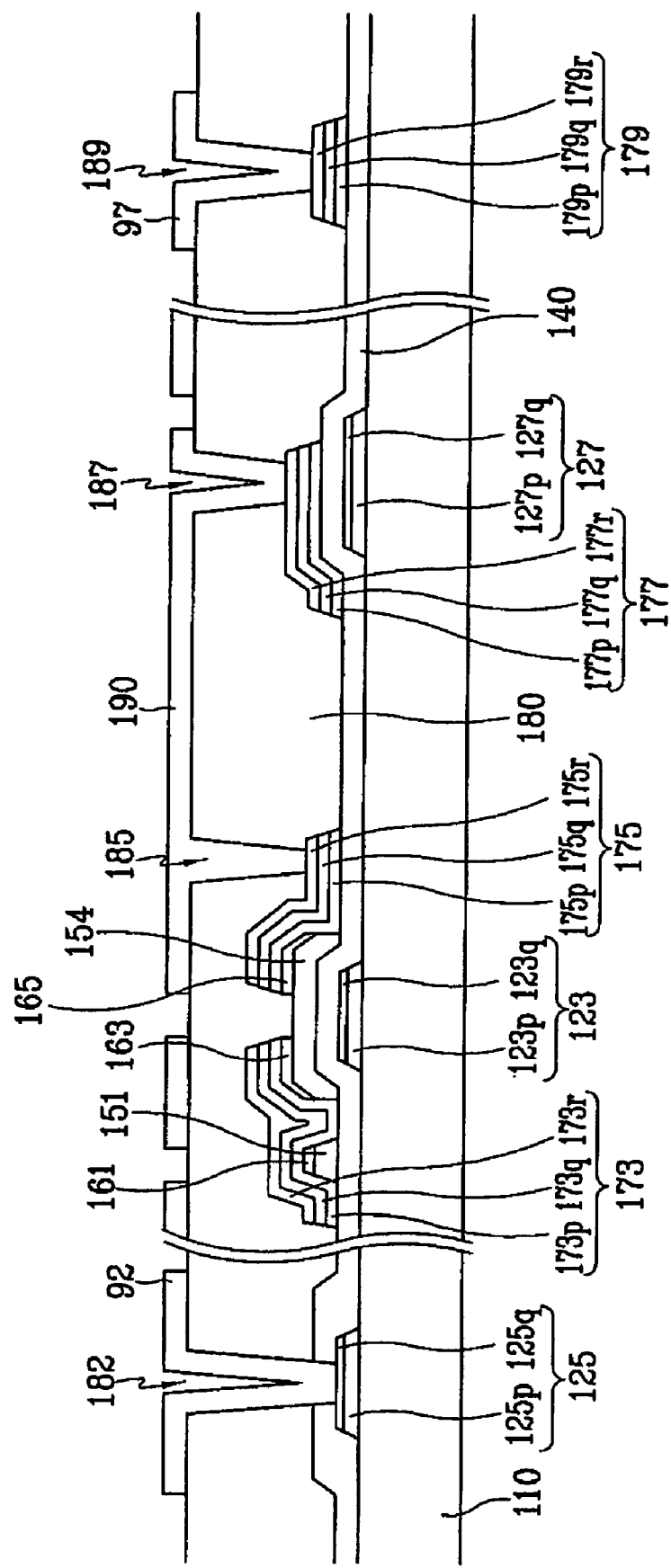
FIG. 21 is a sectional view of the TFT array panel shown in FIG. 20 taken along the line XXI-XXI'.

FIG. 20 is a layout view of an exemplary TFT array panel for an LCD according to another embodiment of the present invention, and FIG. 21 is a sectional view of the TFT array panel shown in FIG. 20 taken along the line XXVII-XXVII'.

As shown in FIGS. 20 and 21, a layered structure of a TFT array panel of an LCD according to this embodiment is almost the same as that shown in FIGS. 4 and 5. That is, a plurality of gate lines 121 including a plurality of gate electrodes 123 are formed on a substrate 110, and a gate insulating layer 140, a plurality of semiconductor stripes 151 including a plurality of projections 154, and a plurality of ohmic contact stripes 161 including a plurality of projections 163 and a plurality of ohmic contact islands 165 are sequentially formed thereon. A plurality of data lines 171 including a plurality of source electrodes 173 and a plurality of drain electrodes 175 are formed on the ohmic contacts 161 and 165, and a passivation layer 180 is formed thereon. A plurality of contact holes 182 and 189 exposing expansions 125 and 179 of the gate lines 121 and the data lines 171 are provided at the passivation layer 180 and/or the gate insulating layer 140, and a plurality of pixel electrodes 190 and a plurality of contact assistants 92 and 97 are formed thereon.

Different from the TFT array panel shown in FIGS. 4 and 5, the data lines 171 and the drain electrodes 175 includes a bottom layer 171*p* preferably made of Mo or Mo alloy, an intermediate layer 171*q* preferably made of Al or Al alloy, and a top layer 171*r* preferably made of Mo or Mo alloy.

Now, a method of manufacturing the TFT array panel shown in FIGS. 20 and 21 according to an embodiment of the present invention will be described in detail with reference to FIGS. 22A-32 as well as FIGS. 20 and 21.

FIGS. 22A, 23A, 24A and 25A are layout views of the TFT array panel shown in FIGS. 20 and 21 in intermediate steps of a manufacturing method thereof according to an embodiment of the present invention, and FIGS. 22B, 23B, 24B and 25B are sectional views of the TFT array panel shown in FIGS. 22A, 23A, 24A and 25A taken along the lines VIB-VIB', VIIB-VIIB', VIIIB-VIIIB', and IXB-IXB', respectively.

Two conductive films, a lower conductive film and an upper conductive film are sputtered in sequence on an insulating substrate 110 such as transparent glass. The lower conductive film has a thickness of about 1,500-3,000 Å, preferably 2,500 Å and is made of Al—Nd alloy, while the upper conductive film has a thickness of about 300-600 Å, preferably 500 Å and is made of Mo.

Figure 22A:
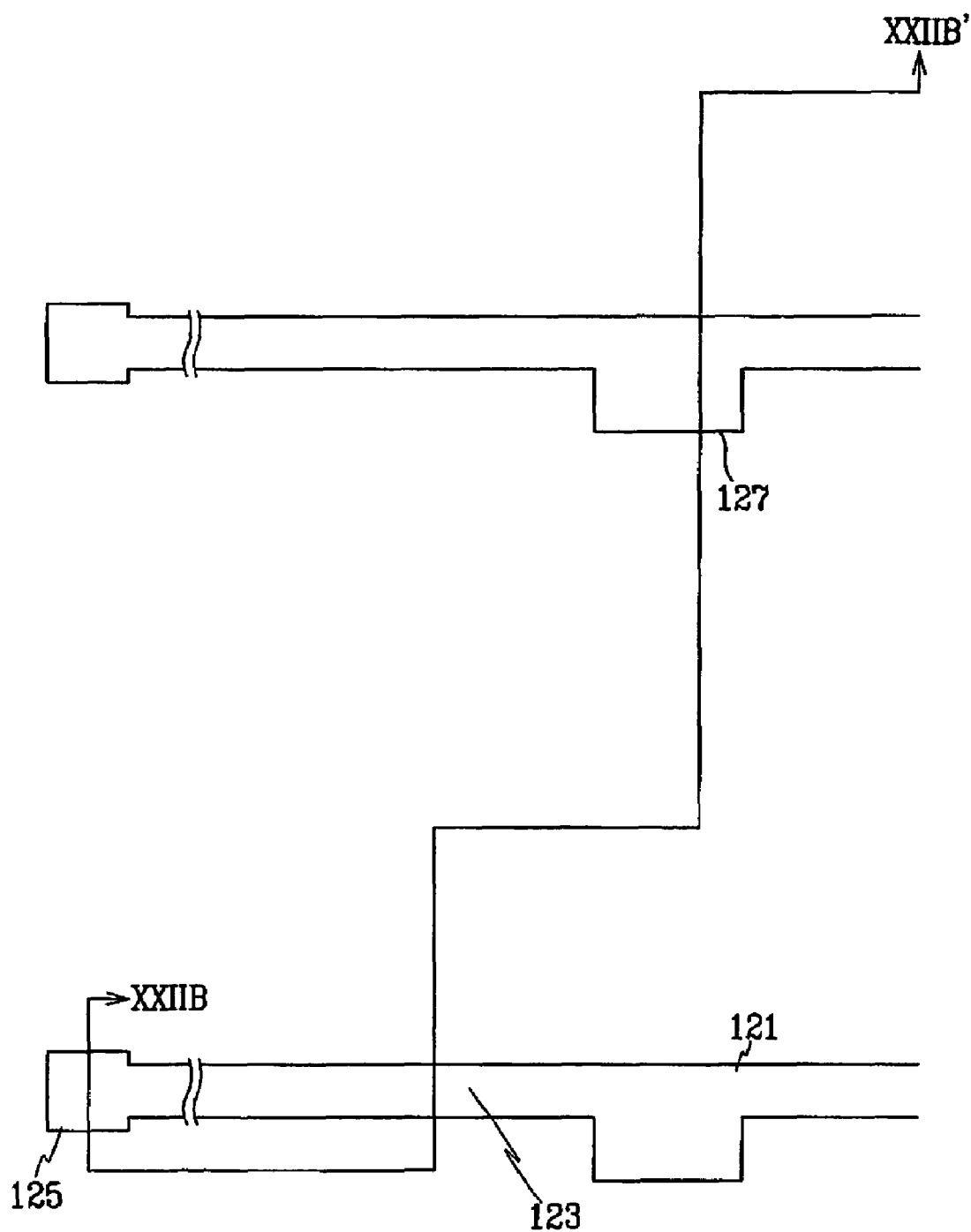
FIGS. 22A, 23A, 24A and 25A are layout views of the TFT array panel shown in FIGS. 20 and 21 in intermediate steps of a manufacturing method thereof according to an embodiment of the present invention.
Figure 22B:
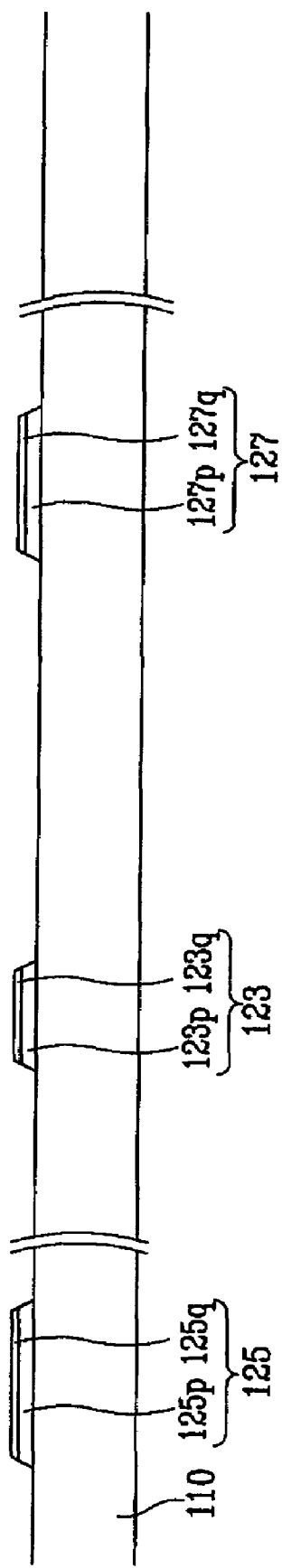

Referring to FIGS. 22A and 22B, the upper conductive film and the lower conductive film are simultaneously patterned by photolithography and wet etch with an etchant to form a plurality of gate lines 121 including a plurality of gate electrodes 123, a plurality of projections 127, and a plurality of expansions 125. The etchant contains about 65-75% $H_3PO_4$, about 0.5-4% $HNO_3$, about 9-13% $CH_3COOH$, about 2-5% stabilizer, and deionized water. The stabilizer includes oxy-hydride inorganic acid represented by $M(OH)_xL_y$, where M is Zn, Sn, Cr, Al, Ba, Fe, Ti, Si or B, L is $H_2O$, $NH_3$, CN or $NH_2R$ (where R is alkyl group), X is 2 or 3, and Y is 0, 1, 2 or 3. Although the elements contained in the etchant are the same as those described with reference to FIGS. 6A and 6B, the percentages thereof are different since the materials forming the gate lines 121 are different.

Figure 23A:
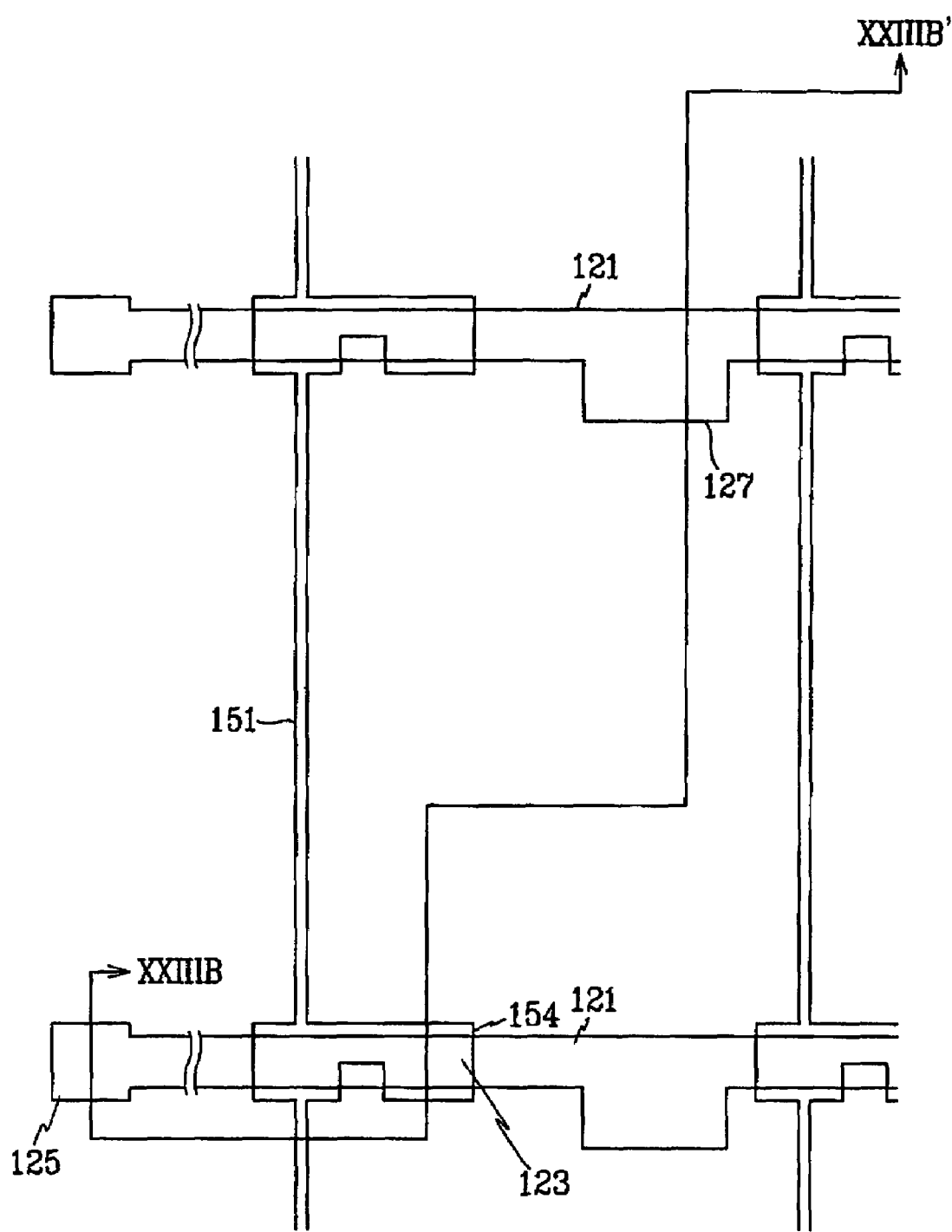
Figure 23B:
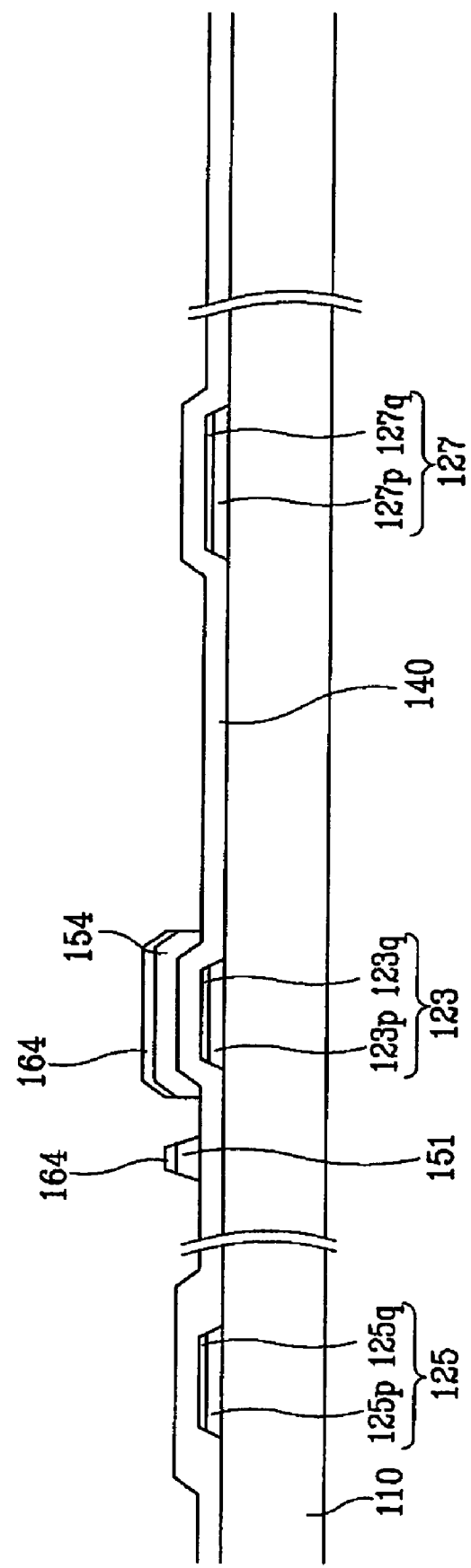

Referring to FIGS. 23A and 23B, after sequential deposition of a gate insulating layer 140, an intrinsic a-Si layer, and an extrinsic a-Si layer, the extrinsic a-Si layer and the intrinsic a-Si layer are photo-etched to form a plurality of extrinsic semiconductor stripes 164 and a plurality of intrinsic semiconductor stripes 151 including a plurality of projections 154 on the gate insulating layer 140.

Figure 24A:
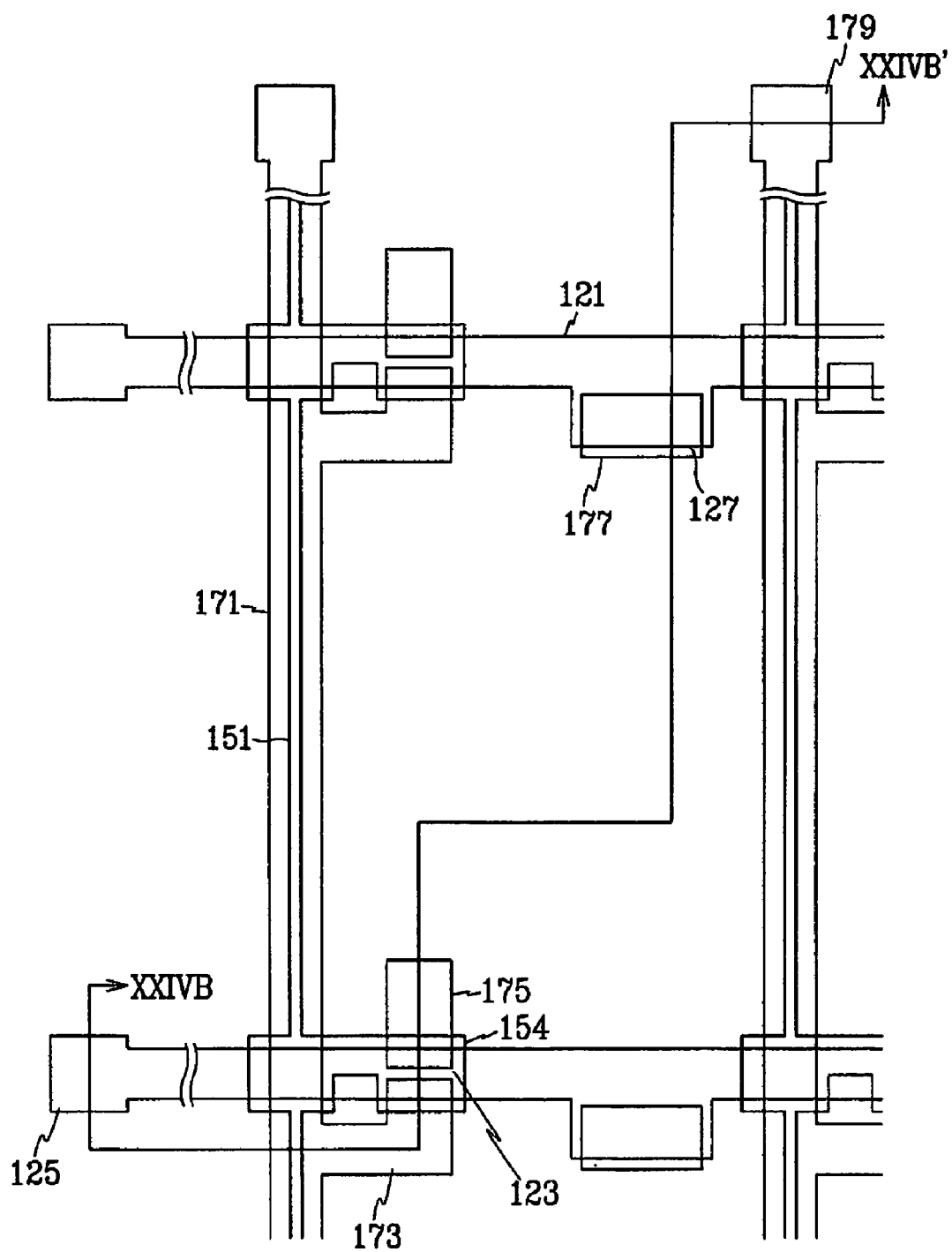

Referring to FIGS. 24A and 24B, a bottom film made of Mo, an intermediate film made of Al—Nd alloy, and a top film made of Mo are sequentially deposited and wet-etched with the etchant used for patterning the gate lines 121 to form a plurality of data lines 171 including a plurality of source electrodes 173 and a plurality of expansions 179, a plurality of drain electrodes 175, and a plurality of storage capacitor conductors 177.

Thereafter, portions of the extrinsic semiconductor stripes 164, which are not covered with the data lines 171, the drain electrodes 175, and the storage capacitor conductors 177, are removed to complete a plurality of ohmic contact stripes 161 including a plurality of projections 163 and a plurality of ohmic contact islands 165 and to expose portions of the intrinsic semiconductor stripes 151. Oxygen plasma treatment preferably follows thereafter in order to stabilize the exposed surfaces of the semiconductor stripes 151.

Figure 25A:
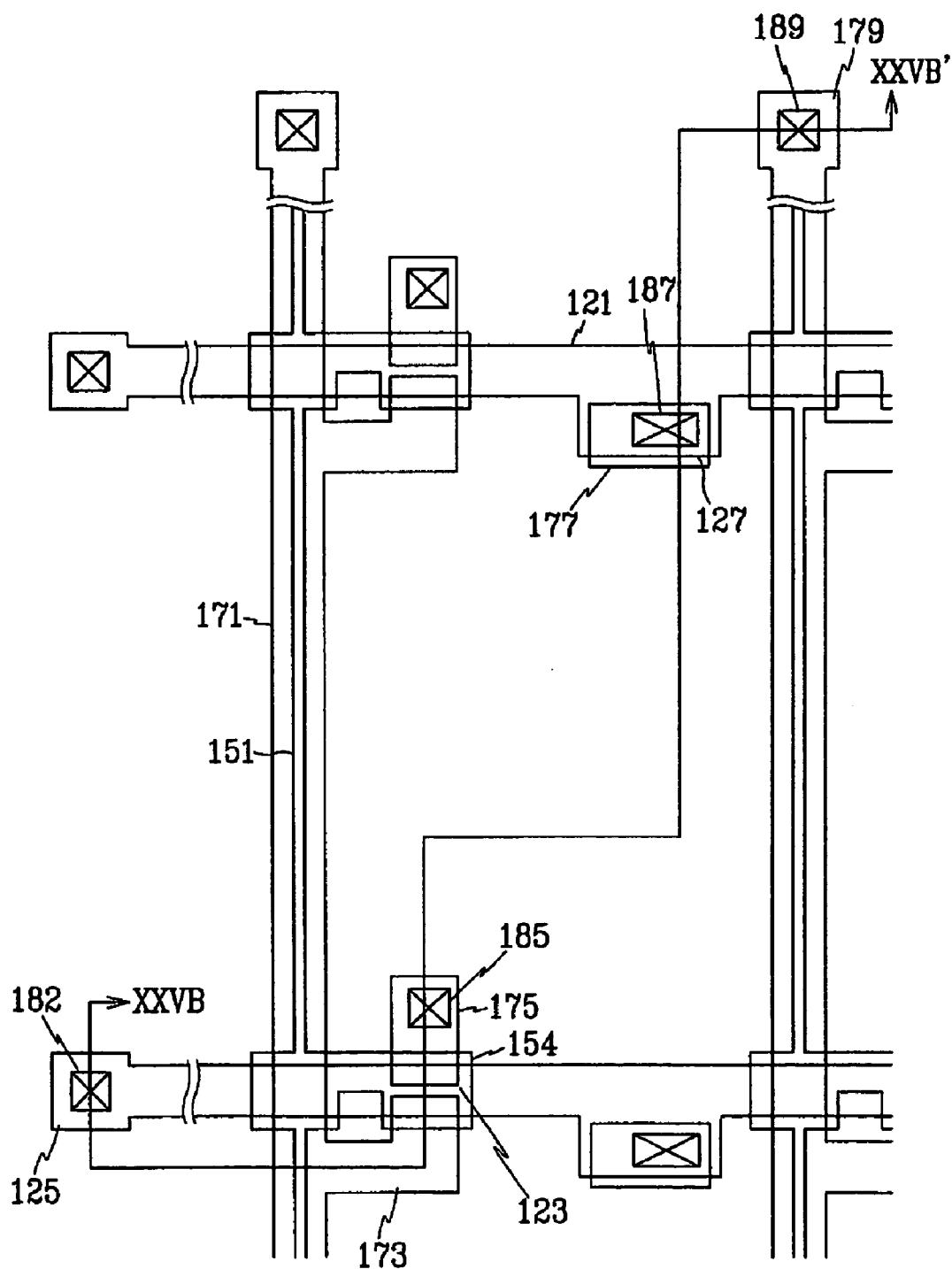
Figure 25B:
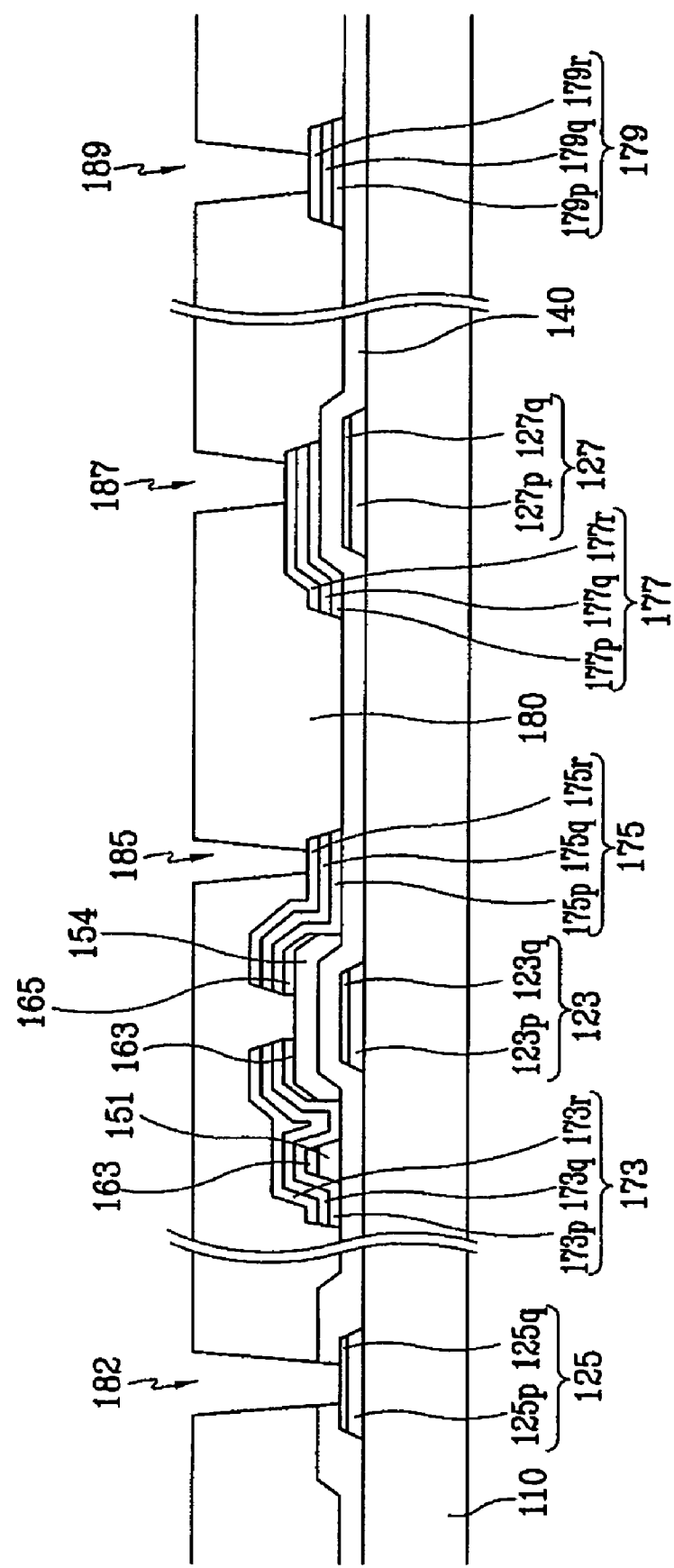

Referring to FIGS. 25A and 25B, a passivation layer 180 is deposited and the passivation layer 180 and the gate insulating layer 140 are photo-etched to form a plurality of contact holes 182, 185, 187 and 189 exposing the expansions 125 of the gate lines 121, the drain electrodes 175, the storage capacitor conductors 177, and the expansions 179 of the data lines 171.

Finally, as shown in FIGS. 20 and 21, a plurality of pixel electrodes 190 and a plurality of contact assistants 92 and 97 are formed on the passivation layer 180 by sputtering and photo-etching an IZO layer having a thickness of about 800-1,000 Å, preferably 900 Å with the etchant used for etching the gate lines 121 and the data lines 175.

According to another embodiment of the present invention, a plurality of color filters (not shown) are provided under the pixel electrodes.

As described above, the gate lines 121, the data lines 171, and the pixel electrodes 190 are etched by using a single etchant with elements having percentages depending on materials to be etched. Accordingly, the manufacturing method and apparatus are simplified, thereby reducing the manufacturing cost.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A method of manufacturing a thin film transistor array panel, the method comprising:
    forming a gate conductor on an insulating substrate;
    forming a gate insulating layer;
    forming a semiconductor member;
    forming a data conductor; and
    forming a pixel electrode connected to the data conductor,
       wherein the gate conductor, the data conductor, and the pixel electrode are formed using a single etchant,
       wherein the etchant comprises about 50-60% $H_3PO_4$, about 6-10% $HNO_3$, about 15-25% $CH_3COOH$, about 2-5% stabilizer, and deionized water.

2. The method of claim 1, wherein the stabilizer comprises oxy-hydride inorganic acid represented by $M(OH)_xL_y$, where M includes at least one of Zn, Sn, Cr, Al, Ba, Fe, Ti, Si and B, L includes at least one of $H_2O$, $NH_3$, CN and $NH_2R$ (where R is alkyl group), X is 2 or 3, and Y is 0, 1, 2 or 3.

3. The method of claim 2, wherein the gate conductor comprises a lower film of Al or Al alloy and an upper film of Mo or Mo alloy.

4. The method of claim 3, wherein the lower film and the upper film comprises Al—Nd and MoW, respectively.

5. The method of claim 3, wherein the data conductor comprises Mo or Mo alloy.

6. The method of claim 5, wherein the pixel electrode comprises IZO.

7. The method of claim 6, wherein the lower layer of the gate conductor, the upper layer of the gate conductor, the data conductor, and the pixel electrode have thickness of about 1,500-3,000 Å, about 300-600 Å, about 1,500-3,000 Å, and about 800-1,000 Å, respectively.

8. A method of manufacturing a thin film transistor array panel, the method comprising:
    forming a gate conductor on an insulating substrate;
    forming a gate insulating layer;
    forming a semiconductor member;
    forming a data conductor; and
    forming a pixel electrode connected to the data conductor,
       wherein the gate conductor, the data conductor, and the pixel electrode are formed using a single etchant,
       wherein the etchant comprises about 65-75% $H_3PO_4$, about 0.5-4% $HNO_3$, about 9-13% $CH_3COOH$, about 2-5% stabilizer, and deionized water.

9. The method of claim 8, wherein the stabilizer comprises oxy-hydride inorganic acid represented by $M(OH)_xL_y$, where M includes at least one of Zn, Sn, Cr, Al, Ba, Fe, Ti, Si and B, L includes at least one of $H_2O$, $NH_3$, CN and $NH_2R$ (where R is alkyl group), X is 2 or 3, and Y is 0, 1, 2 or 3.

10. The method of claim 9, wherein the gate conductor comprises a lower film of Al or Al alloy and an upper film of Mo.

11. The method of claim 10, wherein the lower film comprises Al—Nd.

12. The method of claim 10, wherein the data conductor comprises a bottom layer of Mo, an intermediate layer of Al or Al alloy, and a top layer of Mo.

13. The method of claim 12, wherein the pixel electrode comprises IZO.

14. A method of manufacturing a thin film transistor array panel, the method comprising:
    forming a gate conductor on an insulating substrate;
    forming a gate insulating layer;
    forming a semiconductor member;
    forming a data conductor; and
    forming a pixel electrode connected to the data conductor,
        wherein at least one of the gate conductor, the data conductor, and the pixel electrode are formed by using an etchant including a phosphoric acid of about 50-60%, a nitric acid of about 6-10%, an acetic acid of about 15-25%, a stabilizer of about 2-5% stabilizer, and deionized water, or an etchant including a phosphoric acid of about 65-75%, a nitric acid of about 0.5-4%, an acetic acid of about 9-13%, a stabilizer of about 2-5% stabilizer, and deionized water, wherein the stabilizer includes oxy-hydride inorganic acid represented by $M(OH)_xL_y$, where M includes at least one of Zn, Sn, Cr, Al, Ba, Fe, Ti, Si and B, L includes at least one of $H_2O$, $NH_3$, CN and $NH_2R$ (where R is alkyl group), X is 2 or 3, and Y is 0, 1, 2 or 3.

15. The method of claim 14, wherein at least two of the gate conductor, the data conductor, and the pixel electrode comprise at least one of Mo, Mo alloy, Al, Al alloy, and IZO.

16. The method of claim 14, wherein each of the gate conductor, the data conductor, and the pixel electrode comprises at least one of Mo, Mo alloy, Al, Al alloy, and IZO.

17. The method of claim 1, wherein at least one of the gate conductor and the data conductor comprises at least two layers.

* * * * *